US012777822B2

(12) United States Patent
Wang et al.

(10) Patent No.: US 12,777,822 B2
(45) Date of Patent: Oct. 27, 2026

(54) DISPLAY PANELS AND DISPLAY DEVICES

(71) Applicants: Chengdu BOE Optoelectronics Technology Co., Ltd., Chengdu (CN); BOE TECHNOLOGY GROUP CO., LTD., Beijing (CN)

(72) Inventors: Wei Wang, Beijing (CN); Yi Zhang, Beijing (CN); Tianci Chen, Beijing (CN); Ping Wen, Beijing (CN); Siyu Wang, Beijing (CN); Chang Luo, Beijing (CN); Junxiu Dai, Beijing (CN); Yu Wang, Beijing (CN); Yang Zeng, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 366 days.

(21) Appl. No.: 18/698,161

(22) PCT Filed: Jan. 3, 2023

(86) PCT No.: PCT/CN2023/070127

§ 371 (c)(1),
(2) Date: Apr. 3, 2024

(87) PCT Pub. No.: WO2024/145749

PCT Pub. Date: Jul. 11, 2024

(65) Prior Publication Data

US 2025/0241180 A1 Jul. 24, 2025

(51) Int. Cl.

| | |
|---|---|
| ***H10K 59/80*** | (2023.01) |
| ***G06F 3/041*** | (2006.01) |
| *H10K 102/00* | (2023.01) |

(52) U.S. Cl.
CPC ....... *H10K 59/879* (2023.02); *G06F 3/04164* (2019.05); *H10K 59/873* (2023.02); *H10K 2102/311* (2023.02)

(58) Field of Classification Search
CPC ........................... H10K 59/879; H10K 71/851
(Continued)

(56) References Cited

U.S. PATENT DOCUMENTS

| | | | |
|---|---|---|---|
| 11,495,771 | B2 | 11/2022 | Jo et al. |
| 2015/0034935 | A1 | 2/2015 | Choi |

(Continued)

FOREIGN PATENT DOCUMENTS

| | | | | |
|---|---|---|---|---|
| CN | 111697027 A | | 9/2020 | |
| CN | 114220933 A | * | 3/2022 | ........... H10K 50/858 |

(Continued)

OTHER PUBLICATIONS

International Search Report of PCT/CN2023/070127 issued by ISA/CN dated Sep. 11, 2023, with English Translation, (6p).

(Continued)

*Primary Examiner* — Duane N Taylor, Jr.
(74) *Attorney, Agent, or Firm* — Arch & Lake LLP

(57) ABSTRACT

A display panel has a display area and a non-display area. A cutting channel is provided in the non-display area. The display panel includes a base substrate, a first optical functional layer and a second optical functional layer. The first optical functional layer is provided on a side of the base substrate; the first optical functional layer in the display area has an optical pattern. The second optical function layer is provided on a side of the first optical function layer away from the base substrate; the second optical function layer covers the optical pattern of the first optical function layer and extends to a side of the base substrate close to the cutting (Continued)

channel. The first optical functional layer and the second optical functional layer have different refractive indexes.

20 Claims, 13 Drawing Sheets

(58) Field of Classification Search
USPC .......................................................... 345/173
See application file for complete search history.

(56) References Cited

U.S. PATENT DOCUMENTS

| | | | |
|---|---|---|---|
| 2020/0295297 | A1 | 9/2020 | Jo et al. |
| 2021/0384272 | A1 | 12/2021 | Zhang et al. |
| 2023/0024760 | A1 | 1/2023 | Jo et al. |

FOREIGN PATENT DOCUMENTS

| | | | | | |
|---|---|---|---|---|---|
| CN | 114220934 | A | * | 3/2022 | ......... H10K 50/8428 |
| CN | 217405433 | U | | 9/2022 | |
| CN | 115275056 | A | | 11/2022 | |
| CN | 115528076 | A | | 12/2022 | |
| CN | 115411087 | B | * | 8/2025 | ............. H10K 59/35 |
| WO | 2023108706 | A1 | | 6/2023 | |

OTHER PUBLICATIONS

Written Opinion of the International Searching Authority of PCT/CN2023/070127 dated Sep. 11, 2023, with English Translation, (8p).
The extended European search report of EP Application No. 23913911.6 dated Oct. 10, 2025, (10p).

* cited by examiner

DISPLAY PANELS AND DISPLAY DEVICES

CROSS REFERENCE TO RELATED APPLICATION

This application is the U.S. national phase application of PCT Application No. PCT/CN2023/070127, filed Jan. 3, 2023 and titled "DISPLAY PANELS AND DISPLAY DEVICES", the entire content of which is incorporated herein by reference for all purposes.

TECHNICAL FIELD

This disclosure relates to the field of display technology, and specifically, to a display panel and a display device.

BACKGROUND

Organic Light Emitting Display (OLED) has many advantages such as self-illumination, high brightness, wide viewing angle, short response time, high definition and contrast, can be produced with R, G, and B full-color components, and has gradually become the display device of choice. However, with the continuous development of science and technology, people's purposeful demand for OLED display devices is also gradually increasing.

SUMMARY

This disclosure is directed to overcome the above-mentioned shortcomings of the related art and provide a display panel and a display device.

According to one aspect of this disclosure, a display panel is provided and has a display area and a non-display area, where a cutting channel is provided in the non-display area, and the display panel includes:

a base substrate; and a first optical functional layer, provided on a side of the base substrate, where the first optical functional layer in the display area is provided with an optical pattern, and a non-zero first distance is provided between an edge line, close to the cutting channel, of the first optical functional layer and the cutting channel; and a second optical functional layer, provided on a side of the first optical functional layer away from the base substrate, where the second optical functional layer covers the optical pattern of the first optical functional layer and extends to a side of the base substrate close to the cutting channel, a non-zero second distance is provided between an edge line, close to the cutting channel, of the second optical functional layer and the cutting channel, and the first distance is greater than the second distance;

where a refractive index of the first optical function layer is different from a refractive index of the second optical function layer.

In some embodiments of this disclosure, a difference between the first distance and the second distance is greater than or equal to 30 microns.

In some embodiments of this disclosure, the display panel further includes:

a crack blocking structure, provided on a side of the cutting channel close to the display area, where the first optical functional layer covers a part of the crack blocking structure close to the display area, and the second optical functional layer covers all of the crack blocking structure.

In some embodiments of this disclosure, the first distance is substantially equal to a distance between an edge line, close to the cutting channel, of the display area and the cutting channel, and the second optical functional layer extend to an edge of the cutting channel close to the display area.

In some embodiments of this disclosure, the display panel further includes:

a touch lead, provided between the base substrate and the first optical functional layer, and located in the non-display area, where the first optical functional layer covers the touch lead, and a part of the non-display area, where the touch lead faces away from the display area, is not provided with the first optical functional layer.

In some embodiments of this disclosure, the first optical functional layer includes a plurality of covering parts, with each covering part covers one touch lead.

In some embodiments of this disclosure, the non-display area includes a bonding area, a bonding pin is provided in the bonding area, the touch lead is connected to the bonding pin, and, in a side of the non-display area close to the bonding area, the first optical functional layer only covers the touch lead.

In some embodiments of this disclosure, the refractive index of the second optical function layer is greater than the refractive index of the first optical function layer, the optical pattern is a recessed part, and at least part of the second optical function layer is located within the recessed part.

In some embodiments of this disclosure, the first optical functional layer and the second optical functional layer are both made from organic insulation materials, and a thickness of the second optical functional layer is greater than a thickness of the first optical functional layer.

In some embodiments of this disclosure, the display panel further includes:

a display substrate, provided between the base substrate and the first optical functional layer, where the display substrate includes a plurality of sub-pixels arranged opposite to the recessed part.

In some embodiments of this disclosure, the display panel further includes:

an encapsulation layer group, provided on a side of the display substrate away from the base substrate; and a touch layer group, provided on a side of the encapsulation layer group away from the base substrate, where the first optical functional layer is provided on a side of the touch layer group away from the base substrate.

In some embodiments of this disclosure, the touch layer group includes:

a first touch layer, provided on the side of the encapsulation layer group away from the base substrate;

a touch insulation layer, provided on a side of the first touch layer away from the base substrate; and a second touch layer, provided on a side of the touch insulation layer away from the base substrate;

where, the touch lead includes a first touch sub-lead, or a second touch sub-lead, or the first touch sub-lead and the second touch sub-lead that are stacked and connected; the first touch layer includes the first touch sub-lead, and the second touch layer includes the second touch sub-lead.

In some embodiments of this disclosure, the non-display area includes a bending area, and the display panel further includes:

a third inorganic layer, provided between the base substrate and a light-emitting layer group, where a first groove is provided on the third inorganic layer, an orthographic projection of the bending area on the base substrate overlaps with an orthographic projection of the first groove on the base substrate, and the third inorganic layer is not provided in the bending area.

In some embodiments of this disclosure, an edge line of the bending area close to the display area is a first edge line, the first optical functional layer and the second optical functional layer both extend into the bending area, a non-zero third distance is provided between an edge line, close to the first edge line, of the first optical function layer and the first edge line, a non-zero fourth distance is provided between an edge line, close to the first edge line, of the second optical function layer and the first edge line, and the fourth distance is greater than the third distance.

In some embodiments of this disclosure, an edge line of the bending area close to the display area is a first edge line, the first optical functional layer and the second optical functional layer both extend into a side of the bending area close to the display area, a non-zero third distance is provided between an edge line, close to the first edge line, of the first optical function layer and the first edge line, a non-zero fourth distance is provided between an edge line, close to the first edge line, of the second optical function layer and the first edge line, and the third distance is greater than the fourth distance.

In some embodiments of this disclosure, an absolute value of a difference between the fourth distance and the third distance is greater than or equal to 5 microns.

In some embodiments of this disclosure, the display panel further includes:

a bonding pin, provided in the non-display area, where the first optical functional layer and the second optical functional layer both extend to a side of the bonding pin away from the base substrate, a non-zero fifth distance is provided between an edge line, close to the bonding pin, of the first optical functional layer and an edge line, close to the display area, of the bonding pin, a non-zero sixth distance is provided between an edge line, close to the bonding pin, of the second optical functional layer and the edge line, close to the display area, of the bonding pin, and the sixth distance is greater than the fifth distance.

In some embodiments of this disclosure, an absolute value of a difference between the sixth distance and the fifth distance is greater than or equal to 5 microns.

In some embodiments of this disclosure, an orthographic projection of an edge line of the first optical functional layer on the base substrate is configured as a curve, and an orthographic projection of an edge line of the second optical functional layer on the base substrate is configured as a curve.

In some embodiments of this disclosure, the display panel further includes:

a shielding layer, provided on the side of the touch layer group away from the base substrate, where the shielding layer includes a first shielding part, and the first shielding part is located in the non-display area.

In some embodiments of this disclosure, the display panel further includes:

a reflective layer, provided in the non-display area, where an orthographic projection of the reflective layer on the base substrate is located within an orthographic projection of the first shielding part on the base substrate.

In some embodiments of this disclosure, the reflective layer includes:

a first lead, provided between the base substrate and the first optical functional layer, and located in the non-display area; and a touch lead, provided between the base substrate and the first optical functional layer.

In some embodiments of this disclosure, the first lead includes a gate line and/or a data line and/or a power line.

In some embodiments of this disclosure, the display area of the display panel is provided with a light-transmitting part, and the shielding layer further includes:

a second shielding part, configured to cover a non-luminescent area around the light-transmitting part.

In some embodiments of this disclosure, the display panel further includes: a color film layer, provided on a side of the second optical functional layer away from the base substrate, or on a side of the first optical functional layer close to the base substrate; where the color film layer includes a plurality of filter parts arranged opposite to sub-pixels.

According to another aspect of this disclosure, a display device is provided and includes the display panel according to any embodiment(s) as described above.

It should be understood that the foregoing general description and the following detailed description are exemplary and explanatory only, and do not limit this disclosure.

BRIEF DESCRIPTION OF THE DRAWINGS

The accompanying drawings, which are incorporated in and constitute a part of this specification, illustrate embodiments consistent with the disclosure and together with the description, serve to explain the principles of the disclosure. Apparently, the drawings in the following description are only some embodiments of this disclosure. For those of ordinary skill in the art, other drawings can be obtained based on these drawings without exerting creative efforts.

Figure 1:
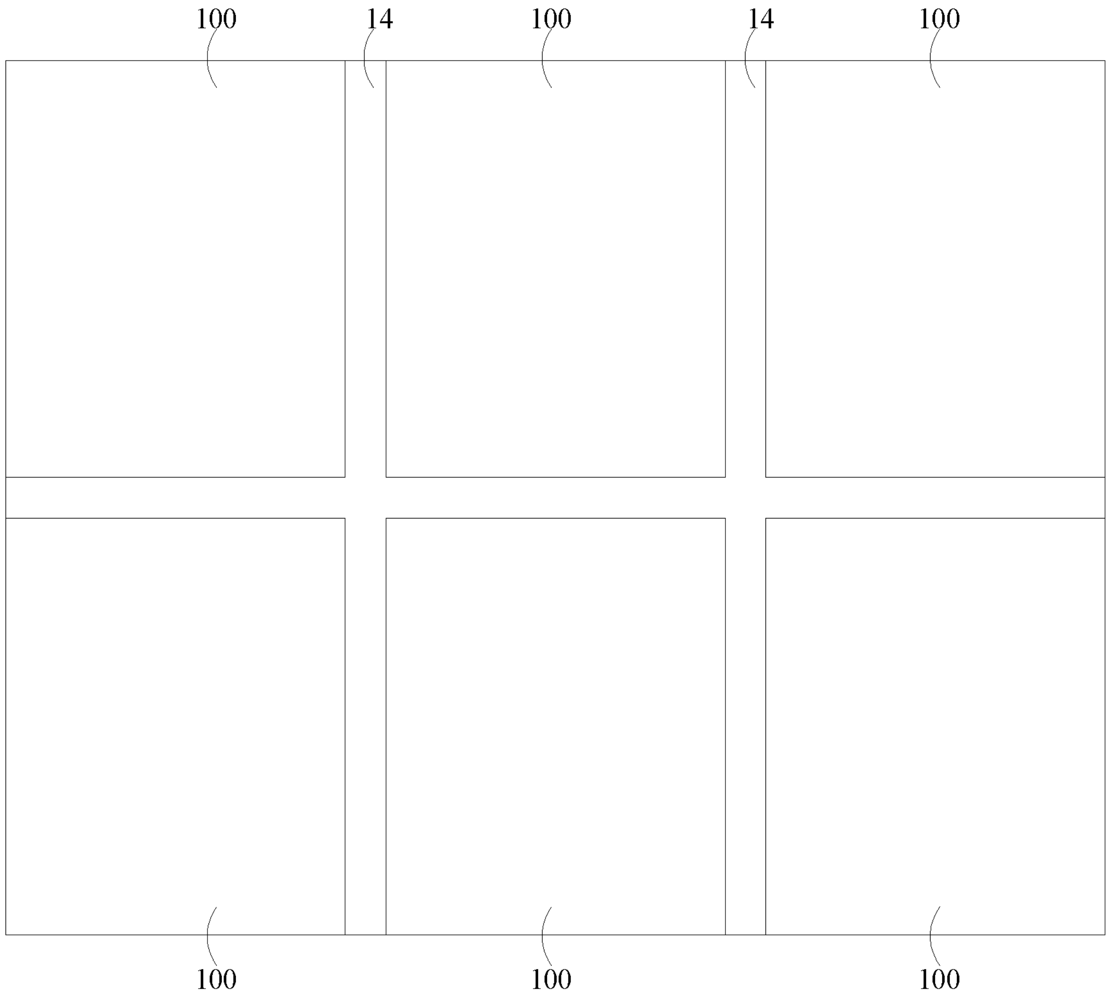
FIG. 1 is a schematic structural diagram after preparing multiple display panels on a motherboard.

Explanation of reference symbols in the display panel of this disclosure are given as follows:

100, display panel; 10, display substrate; 1, base substrate;

2, driving backplane; 21, light-shielding layer; 22, buffer layer; 231, channel part; 232, source connection part; 233, drain connection part; 24, gate insulation layer; 25, gate electrode; 26, inter-layer dielectric layer; 27, first connection conductor layer; 271, source electrode; 272, drain electrode; 28, planarization layer; 29, third inorganic layer; 291, first groove; 292, second groove; 30, organic material layer;

3, light-emitting substrate; 31, first electrode; 32, pixel definition layer; 33, light-emitting layer group; 34, second electrode; 35, sub-pixel;

4, encapsulation layer group; 41, first inorganic layer; 42, organic layer; 43, second inorganic layer;

5, touch layer group; 51, first touch layer; 52, touch insulation layer; 53, second touch layer;

61, touch body; 611, first touch unit; 6111, first touch electrode; 6112, first connection part; 612, second touch unit; 6121, second touch electrode; 6122, second connection part; 62, touch lead; 621, first touch lead; 622, second touch lead;

71, first optical functional layer; 711, optical pattern; 712, covering part; 72, second optical functional layer;

8, shielding layer; 81, first shielding part; 82, second shielding part;

9, color film layer; 10, display driver chip; 11, flexible printed circuit board; 12, touch driver chip; 13, cover plate; 14, cutting channel; 15, bonding pins;

16, crack blocking structure; 161, blocking ring;

17, reflective layer; 171, first lead; 18, light-transmitting part;

AA, display area; NA, non-display area; CB, side area; CB1, first side area; CB2, second side area; CB3, third side area; CB4, fourth side area; BEND, bending area; BOD, bonding area;

X, first direction; Y, second direction.

DETAILED DESCRIPTION

Exemplary embodiments will now be described more fully with reference to the accompanying drawings. Exemplary embodiments may, however, be embodied in various forms and should not be construed as limited to the embodiments set forth herein. Instead, these embodiments are provided so that this disclosure will be thorough and complete and will fully convey the concepts of the exemplary embodiments to those skilled in the art. The same reference numerals in the drawings indicate the same or similar structures, and thus their detailed descriptions will be omitted. Furthermore, the drawings are merely schematic illustrations of this disclosure and are not necessarily drawn to scale.

Although relative terms, such as “upper” and “lower” are used in this specification to describe the relative relationship of one component as illustrated to another, these terms are used in this specification only for convenience, for example, according to direction of the example described with reference to the drawings. It will be understood that if the illustrated device were turned upside down, components described as “on/above” would become components as “under/below”. When a structure is “on/above” another structure, it may mean that the structure is integrally formed on the other structure, or that the structure is “directly” placed on the other structure, or that the structure is “indirectly” placed on the other structure through another structure.

The terms “a”, “an”, “the”, “said” and “at least one” are used to indicate the presence of one or more elements/components/etc. The terms “include” and “have” are used to indicate an open-ended inclusion and mean that there may be additional elements/components/etc. in addition to those listed. The terms “first”, “second”, “third” and the like are only used as a marker, not a limit on the number of its objects.

In this application, unless otherwise clearly stated and limited, the term “connection” should be understood in a broad sense. For example, “connection” may be a fixed connection, a detachable connection, or an integral body. It may be a direct connection or an indirect connection through intermediaries. The term “and/or” is just an association relationship that describes related objects, which means that there may be three relationships. For example, A and/or B may include three situations: A alone exists, both A and B exist, and B alone exists. In addition, the character “/” in this disclosure generally indicates that the related objects are in an “or” relationship.

Exemplary embodiments of this disclosure provide a display panel 100. Referring to FIG. 1-FIG. 21, the display panel 100 has a display area AA and a non-display area, and a cutting channel 14 is provided in the non-display area. The display panel 100 may include a base substrate 1, a first optical functional layer 71 and a second optical functional layer 72. The first optical functional layer 71 is provided on one side of the base substrate 1, and the first optical functional layer 71 in the display area AA has an optical pattern 711. A non-zero first distance is provided between an edge line of the first optical functional layer 71 close to the cutting channel 14 and the cutting channel 14. The second optical functional layer 72 is provided on one side of the first optical functional layer 71 away from the substrate 1, and the second optical functional layer 72 covers the optical pattern 711 of the first optical functional layer 71 and extends to the side of the substrate 1 close to the cutting channel 14. A non-zero second distance is provided between an edge line of the second optical functional layer 72 close to the cutting channel 14 and the cutting channel 14, and the first distance is greater than the second distance. The refractive index of the first optical functional layer 71 is different from that of the second optical functional layer 72.

In the display panel 100 of this disclosure, on the one hand, the non-zero first distance is provided between the edge line of the first optical functional layer 71 close to the cutting channel 14 and the cutting channel 14, and the non-zero second distance is provided between the edge line of the second optical functional layer 72 close to the cutting channel 14 and the cutting channel 14. In other words, the first optical functional layer 71 and the second optical functional layer 72 are not provided at the cutting channel 14, so that no carbon ash will be generated during the cutting process, thereby avoiding a connection between two adjacent conductive wires of the display panel 100 and, thus, preventing poor display. On the other hand, the second optical functional layer 72 covers the optical pattern 711 of the first optical functional layer 71 and extends to the side of the base substrate 1 close to the cutting channel 14. In the part close to the cutting channel 14, the second optical functional layer 72 protrudes from the first optical functional layer 71, and there is only one layer of second optical functional layer 72, so the step difference of the second optical functional layer 72 is small, and bubbles are less likely to appear after the protective film is attached. Furthermore, the first optical functional layer 71 in the display area AA has the optical pattern 711, the second optical functional layer 72 covers the optical pattern 711 of the first optical functional layer 71, and the first optical functional layer 71 and the second optical functional layer 72 have different refractive indexes, so the front light extraction efficiency of the display panel 100 can be adjusted through the first optical functional layer 71 and the second optical functional layer 72.

Referring to FIG. 1, during the preparation process of the display panel 100, multiple display panels 100 are prepared on a larger motherboard, and then multiple individual display panels 100 are formed through cutting along the cutting channel 1.

Figure 2:
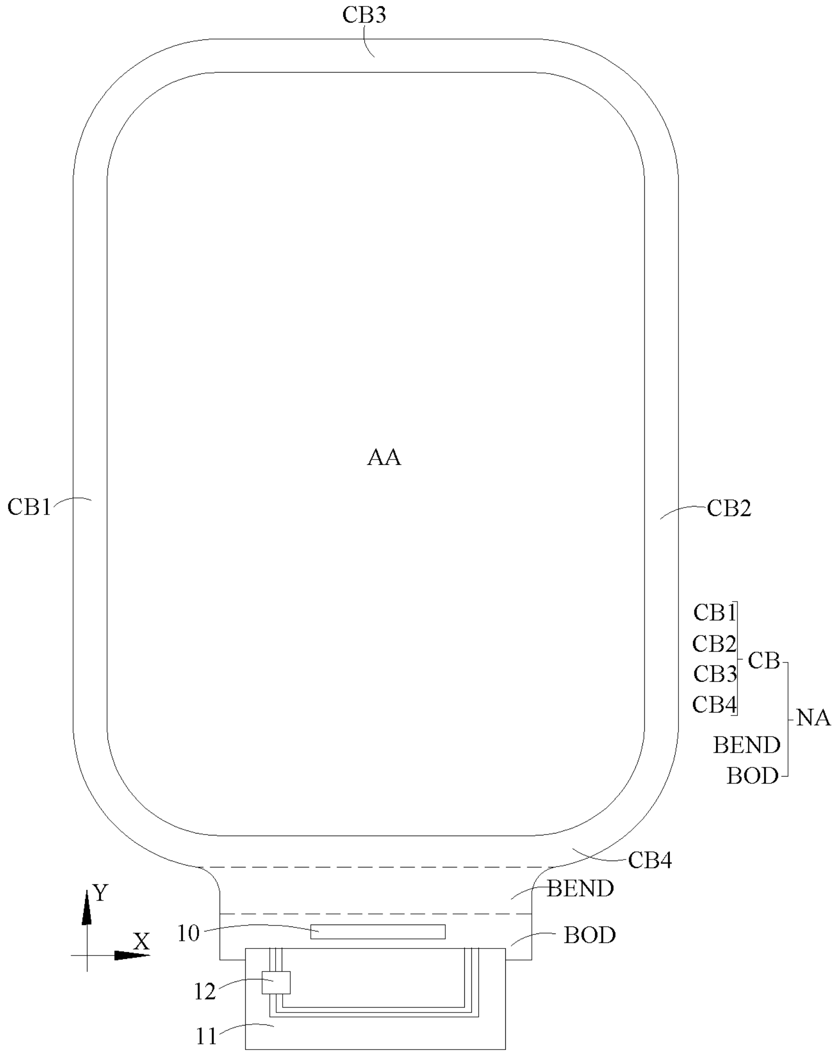
FIG. 2 is a schematic diagram illustrating the area division structure of the display panel according to this disclosure.

Referring to FIG. 2, the display panel 100 may include the display area AA used to display images and the non-display area NA that does not display images. Display and touch functions can be implemented in the display area AA. The non-display area NA may include a side area CB, which may be arranged around the display area AA. The display panel 100 may further include a bending area BEND for bending and a bonding area BOD for bonding. The bending area BEND is connected to the side area CB, and the bonding area BOD is connected to the bending area BEND.

The side area CB may include a first side area CB1, a second side area CB2, a third side area CB3, and a fourth side area CB4. The first side area CB1 and the second side area CB2 are provided on opposite sides of the display area AA in the first direction X. The third side area CB3 and the fourth side area CB4 are provided on opposite sides of the display area AA in the second direction Y. The bonding area BOD is provided on the side of the fourth side area CB4 away from the display area AA. Specifically, the bending area BEND is connected to the fourth side area CB4, and the bonding area BOD is connected to the bending area BEND. That is, the bending area BEND is connected between the bonding area BOD and the fourth side area CB4.

Figure 3:
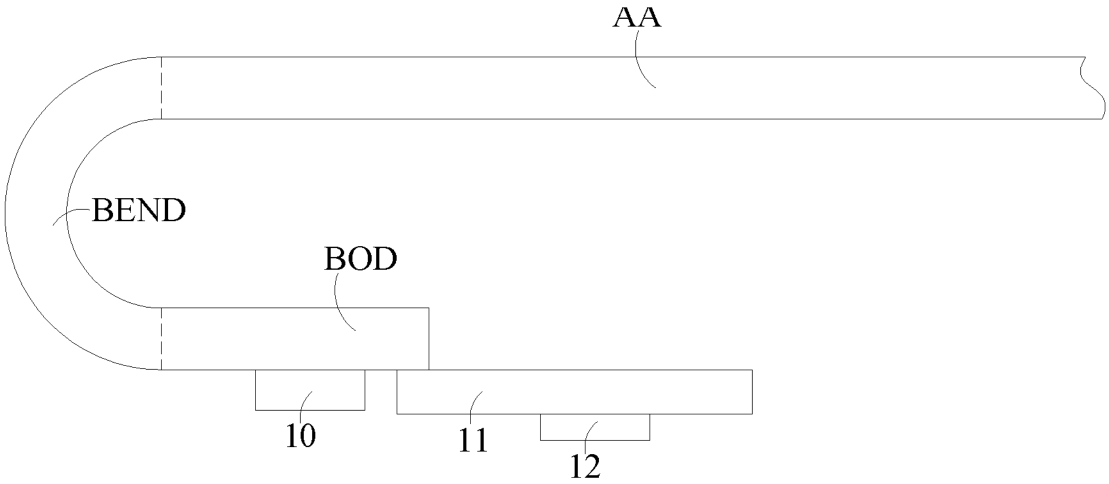
FIG. 3 is a schematic structural diagram of the display panel in FIG. 2 after being bent.

Referring to FIG. 3, the display panel 100 can be bent in the bending area BEND, so that the bonding area BOD is bent to the side of the display area AA away from the display surface.

Figure 7:
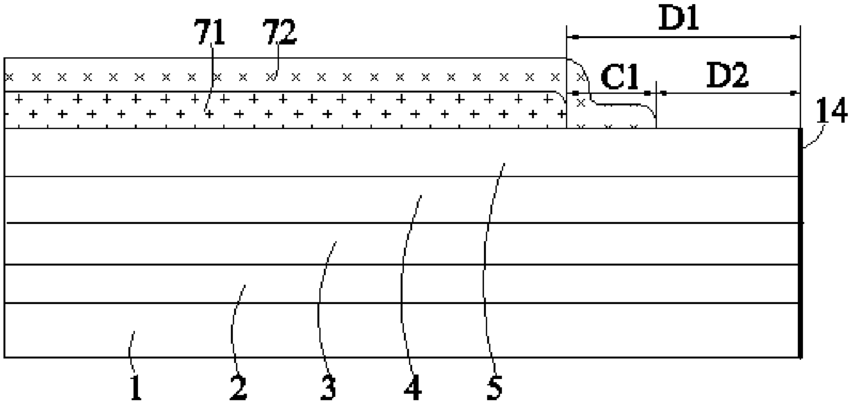
FIG. 7 is a schematic structural diagram illustrating the non-display area of the display panel according to some embodiments of this disclosure.

Referring to FIG. 7, bonding pins 15 are provided in the bonding area BOD, and an external device may be installed (or attached) on the bonding pins 15. The external device may include a display driver chip 10, a touch driver chip 12, a flexible printed circuit board 11, a rigid printed circuit board, or the like. In addition, Chip On Flex (or Chip On Film, COF), connectors, and the like can also be installed on the bonding pins 15 as the external device. One or more external devices may be installed in the bonding area BOD. The display driver chip 10 may be disposed in the bonding area BOD of the display panel 100, and the printed circuit board may be attached to an end of the bonding area BOD. In this case, the display panel 100 may include bonding pins 15 connected to the display driver chip 10 and bonding pins 15 connected to the printed circuit board. In some other embodiments, the display driver chip 10 may be mounted on a COF, and the COF may be attached to the bonding area BOD of the display panel 100.

Referring to FIG. 2, the display driver chip 10 may be installed on the same surface of the display panel 100 as the display surface. The touch driver chip 12 may be installed on the same surface of the flexible printed circuit board 11 as the display surface. Referring to FIG. 3, when the bending area BEND is bent in reverse, the display driver chip 10 and the touch driver chip 12 are located on the side of the display panel 100 away from the display surface. The touch driver chip 12 may be bonded to the flexible printed circuit board 11 through anisotropic conductive adhesive, or may be attached to the flexible printed circuit board 11 through ultrasonic bonding.

The touch driver chip 12 may include an integrated circuit that drives the touch layer group 5, and the touch driver chip 12 may also include an integrated circuit that receives a touch signal. In some embodiments, the integrated circuit may include a touch driving integrated circuit that generates and provides a touch driving signal, and a touch sensing integrated circuit that receives the touch signal, but the invention is not limited thereto. The touch driver chip 12 is connected to the bonding pin 15 of the display panel 100 to provide a touch driving signal to the bonding pin 15 and receive a touch sensing signal fed back by the touch layer group 5.

The display panel 100 may include the base substrate 1 and the display substrate 10. The display substrate 10 may be an OLED (Organic Electroluminescence Display) display substrate, a QLED (Quantum Dot Light Emitting Diodes) display substrate, and the like. The display substrate 10 has a light-emitting side and a non-light-emitting side. The light-emitting side and the non-light-emitting side are opposite to each other. Image can be displayed on the light-emitting side. The side on which the image is displayed is the display surface.

The following takes the OLED display substrate as an example for description.

Figure 4:
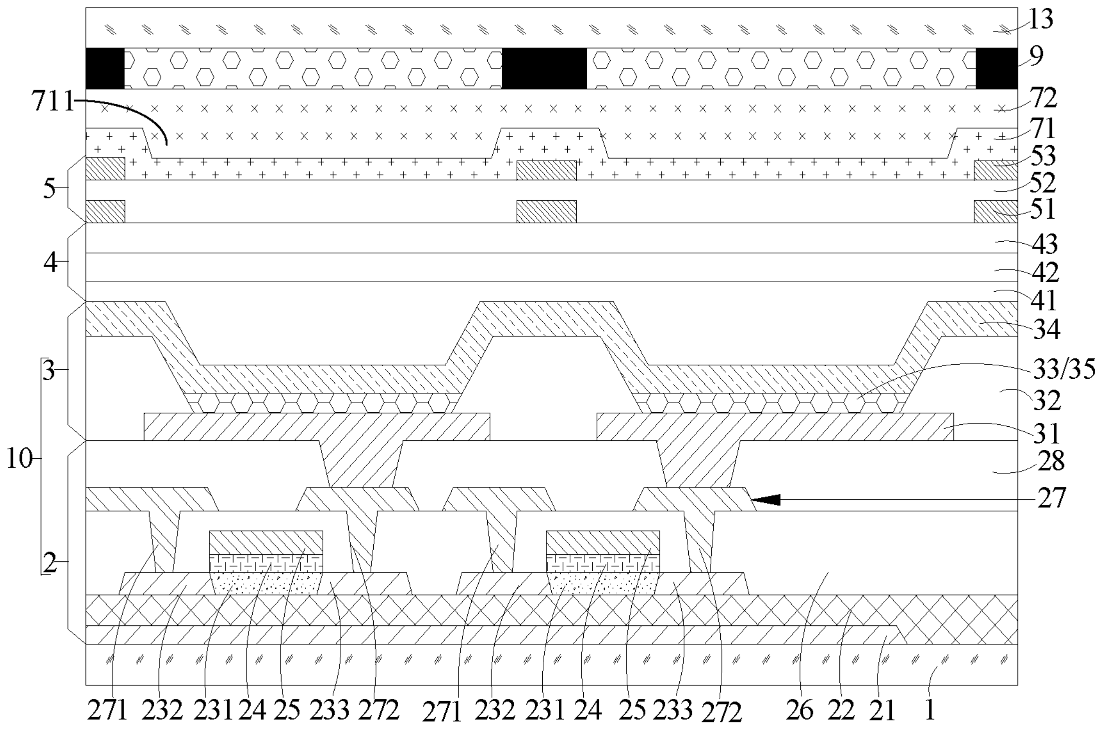
FIG. 4 is a schematic structural diagram illustrating the display area of the display panel according to some embodiments of this disclosure.

Referring to FIG. 4, the display substrate 10 may include a driving backplane 2 and a light-emitting substrate 3. The driving backplane 2 is disposed on one side of the base substrate 1, and the light-emitting substrate 3 is disposed on a side of the driving backplane 2 away from the base substrate 1.

Referring to FIG. 4, the driving backplane 2 may include a plurality of driving circuits arranged in an array, the light-emitting substrate 3 may include a plurality of light-emitting devices arranged in an array, and the driving circuit may drive the light-emitting devices to emit light.

The material of the base substrate 1 may include inorganic material. For example, the inorganic material may be glass, quartz or metal. The material of the base substrate 1 may also include organic material. For example, the organic material may be resin material such as polyimide, polycarbonate, polyacrylate, polyetherimide, polyethersulfone, polyethylene terephthalate, and polyethylene naphthalate. The base substrate 1 may be formed of multiple material layers. For example, the base substrate 1 may include multiple base material layers, and the material of the base material layer may be any of the above-mentioned materials. Alternatively, the base substrate 1 may also be provided as a single layer, and may be made of any of the above materials.

Referring to FIG. 4, a light-shielding layer 21 may also be provided on one side of the base substrate 1. The light incident from the base substrate 1 into the active layer will generate photogenerated carriers in the active layer, thereby affecting the performance of the thin film transistor and, thus, affecting display quality of the display device. The light-shielding layer 21 can block the light incident from the base substrate 1 to avoid affecting the performance of the thin film transistor and the display quality of the display device. Depending on the type of thin film transistor, the light-shielding layer 21 may be omitted.

A buffer layer 22 may also be formed on the side of the light-shielding layer 21 away from the base substrate 1. The buffer layer 22 plays a role in blocking water vapor and impurity ions in the base substrate 1 (especially in organic materials), and increasing hydrogen ions for the active layer subsequently formed. The buffer layer 22 is made from an insulation material, which can insulate and isolate the light-shielding layer 21 from the active layer. The buffer layer 22 may include silicon nitride, silicon oxide, or silicon oxynitride. Depending on the type or process condition of base substrate 1, the buffer layer 22 may be omitted.

The active layer is provided on the side of the buffer layer 22 away from the base substrate 1. The active layer may include a channel part 231 and conductor parts disposed at both ends of the channel part 231. One of the two conductor parts is a source connection part 232, and the other is the drain connection part 233. A gate insulation layer 24 is provided on the side of the active layer away from the base substrate 1, and a gate layer is provided on the side of the gate insulation layer 24 away from the base substrate 1. The gate layer may include a gate electrode 25 and a gate line (not shown in the drawings).

An interlayer dielectric layer 26 is provided on the side of the gate layer away from the base substrate 1, and a via hole is provided on the interlayer dielectric layer 26. The via hole is connected to the source connection part 232 and the drain connection part 233. A first connection conductor layer 27 is provided on the side of the interlayer dielectric layer 26 away from the substrate 1. The first connection conductor layer 27 may include a source electrode 271, a drain electrode 272 and a data line (not shown in the drawings), where the data line may be connected to the source electrode 271, or a part of the data line may serve as the source electrode 271. The source electrode 271 is connected to the source electrode connection part 232 through the via hole on the interlayer dielectric layer 26, and the drain electrode 272 is connected to drain connection part 233 through the via hole on the interlayer dielectric layer 26.

In some other embodiments of this disclosure, a passivation layer is provided on the side of the first connection conductor layer 27 away from the substrate 1, and a via hole is also provided on the passivation layer. A second connection conductor layer is provided on one side of the substrate 1. The second connection conductor layer may include a second source electrode and/or a second drain electrode. The second source electrode and the second drain electrode are correspondingly connected to the source electrode and drain electrode, respectively, through the via hole on the passivation layer. Also, a third connection conductor layer, a fourth connection conductor layer, and the like may also be provided as needed.

Still referring to FIG. 4, a planarization layer 28 is provided on the side of the first connection conductor layer 27 away from the base substrate 1. A via hole is provided on the planarization layer 28, and the via hole is connected to the drain electrode 272. The channel part 231, the gate electrode 25, the source electrode 271, and the drain electrode 272 form a thin film transistor.

It should be noted that the thin film transistor described in this specification is a top gate thin film transistor. In some other embodiments of this disclosure, the thin film transistor may also be a bottom gate type or a double gate type, and the specific structure thereof is not specified here. Furthermore, when thin film transistors with opposite polarities are used or when the current direction changes during circuit operation, the functions of the "source electrode 271" and the "drain electrode 272" may be interchanged with each other. Therefore, in this specification, "source electrode 271" and "drain electrode 272" may be interchanged with each other.

Still referring to FIG. 4, the light-emitting substrate 3 is provided on the side of the planarization layer 28 away from the base substrate 1. The light-emitting substrate 3 may include a first electrode 31, a pixel definition layer 32, a light-emitting layer group 33 and a second electrode. 34.

Specifically, a first electrode 31 layer is provided on a side of the planarization layer 28 away from the base substrate 1. The first electrode 31 layer may include a first electrode 31 and a first lead 171. The first electrode 31 is provided in the display area AA, the first lead 171 is provided in the non-display area NA, the first lead 171 is spaced apart from the first electrode 31, and the first electrode 31 is connected to the drain electrode 272 of the driving backplane 2 through the via hole. The first electrode 31 is provided with the driving signal through the drain electrode 272, and the first electrode 31 may be an anode (pixel electrode).

A pixel definition layer 32 is provided on a side of the first electrode 31 away from the base substrate 1. An opening is provided on the pixel definition layer 32, and the opening is connected to the first electrode 31, so that at least part of the first electrode 31 is not covered by the pixel definition layer 32.

A light-emitting layer group 33 is provided on a side of the pixel definition layer 32 away from the base substrate 1, and at least part of the light-emitting layer group 33 is located in the opening. A second electrode 34 is provided on a side of the light-emitting layer group 33 away from the base substrate 1. The second electrode 34 may be a cathode (common electrode). The light-emitting layer group 33 in an opening emits light to form a sub-pixel 35, so that the orthographic projection of the sub-pixel 35 on the substrate 1 is the orthographic projection of the light-emitting layer group 33 in the opening on the substrate 1. The display substrate 10 may include a plurality of sub-pixels 35.

The light-emitting layer group 33 may include a hole injection layer, a hole transport layer, an organic light-emitting layer, an electron transport layer and an electron injection layer that are stacked in sequence. The hole injection layer is in contact with the first electrode 31 and the electron injection layer is in contact with the second electrode 34. Alternatively, in some other embodiments of this disclosure, the light-emitting layer group 33 may only include a hole transport layer, a light-emitting layer and an electron transport layer. The light-emitting layer group 33 may also have other structures, and its specific structure may be provided as needed.

Holes are injected into the organic light-emitting layer from the side of the first electrode 31, and electrons are injected into the organic light-emitting layer from the side of the second electrode 34. Finally, the holes and electrons recombine in the organic light-emitting layer to generate excitons. When the generated excitons relax from the excited state to the ground state, the OLED emits visible light.

The above is the exemplary structure of the display substrate 10 in the display area AA. In the non-display area NA, the data lines, gate lines and first leads 171 extend to the non-display area NA and are finally connected to the bonding pins 15 in the bonding area B OD.

An encapsulation layer group 4 is provided on the side of the second electrode 34 away from the base substrate 1. Referring to FIG. 4, the encapsulation layer group 4 may be configured as multiple layers. The encapsulation layer group 4 may include an organic layer 42 and an inorganic layer. Specifically, the encapsulation layer group 4 may include a first inorganic layer 41, the organic layer 42 disposed on a side of the first inorganic layer 41 away from the base substrate 1, a second inorganic layer 43 disposed on a side of the organic layer 42 away from the base substrate 1. The materials of the first inorganic layer 41, the organic layer 42 and the second inorganic layer 43 will not be elaborated here. Alternatively, the encapsulation layer group 4 may also include more layers or fewer layers.

In some embodiments, referring to FIG. 4. a touch layer group 5 is provided on the side of the encapsulation layer group 4 away from the base substrate 1. The touch layer group 5 may include a first touch layer 51, a touch insulation layer 52 and a second touch layer 53. The first touch layer 51 is provided on the side of the encapsulation layer group 4 away from the base substrate 1. The first touch layer 51 may be a stacked structure of Ti/Al/Ti, a stacked structure of ITO/Ag/ITO, or the like. The touch insulation layer 52 is provided on the side of the first touch layer 51 away from the base substrate 1, and the material of the touch insulation layer 52 may be SiNx material. The second touch layer 53 is provided on the side of the touch insulation layer 52 away from the base substrate 1. The second touch layer 53 may be a stacked structure of Ti/Al/Ti, a stacked structure of ITO/Ag/ITO, or the like. The materials and structures of the above-mentioned film layers are only examples and, alternatively, can be selected and provided according to needs. A barrier layer may also be included, and the barrier layer may be provided between the encapsulation layer group 4 and the first touch layer 51. The material of the barrier layer may be SiNx material.

Figure 5:
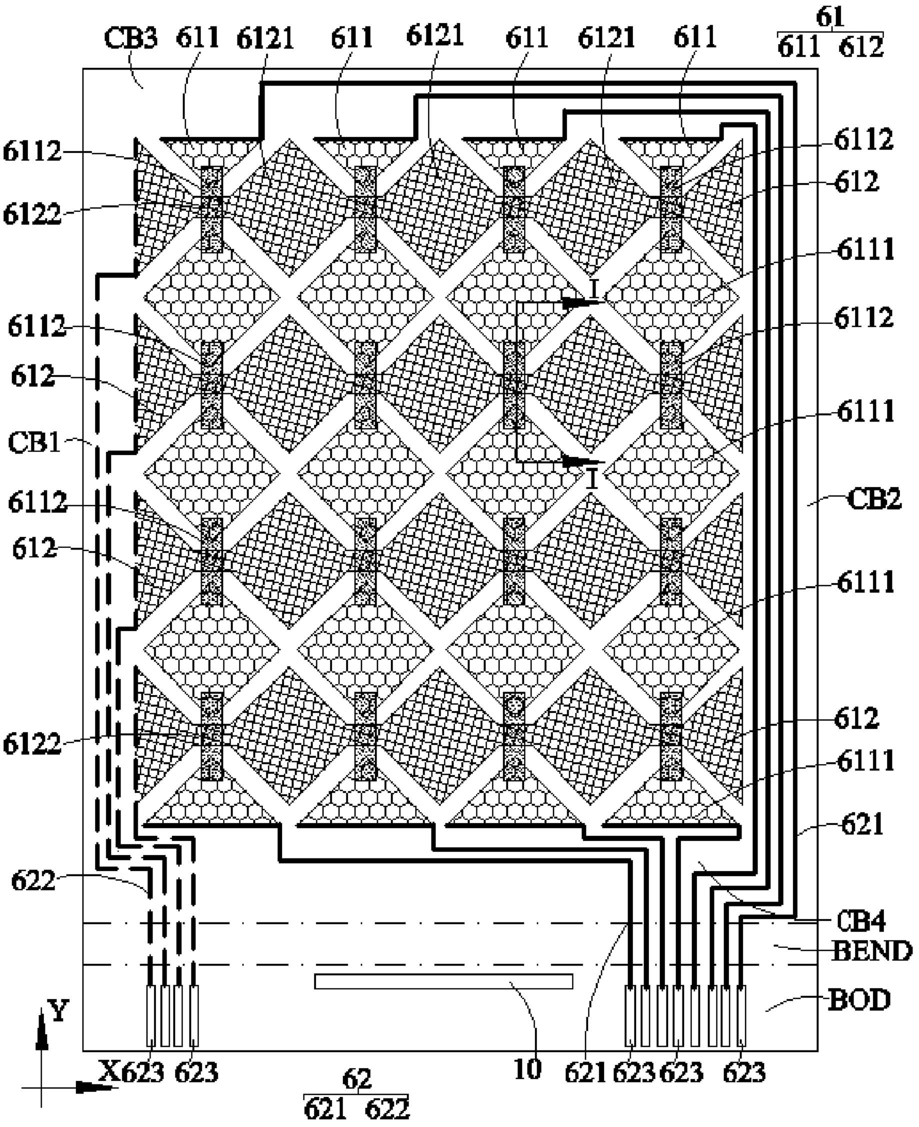
FIG. 5 is a schematic top structural view of a touch layer group of the display panel according to some embodiments of this disclosure.

Referring to FIG. 5, in the display area AA, the first touch layer 51 and the second touch layer 53 are arranged in a conductive grid structure. In other words, the first touch layer 51 and the second touch layer 53 are composed of multiple grids formed by interweaving a plurality of metal lines. The grid is a polygon composed of multiple grid lines. Each grid corresponds to one sub-pixel 35, and the orthographic projection of the sub-pixel 35 on the base substrate 1 is located within the orthographic projection of the grid on the base substrate 1, thereby preventing the grid lines from blocking the light emitted by the sub-pixel 35 and ensuring display effect of the display panel 100.

Figure 6:
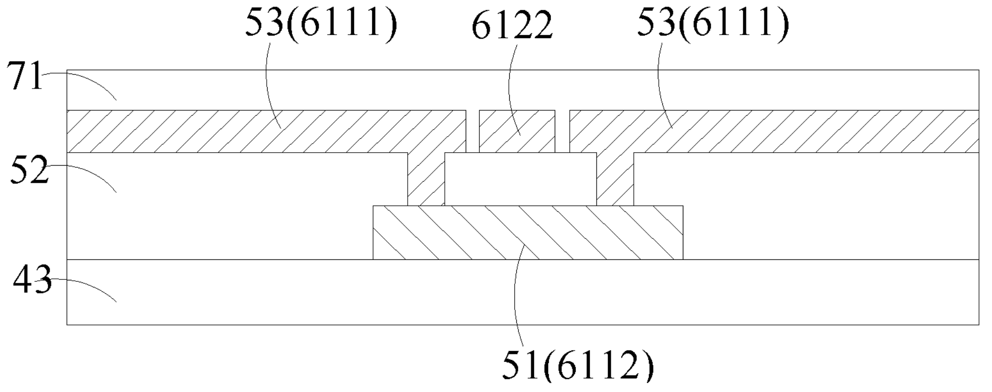
FIG. 6 is a schematic cross-sectional view cut along line I-I in FIG. 5.

Referring to FIG. 5 and FIG. 6, the conductive grid structure forms a touch body part 61, and the touch body part 61 may be a mutual capacitance structure. The touch body 61 may include a plurality of first touch units 611 and a plurality of second touch units 612. The first touch unit 611 and the second touch unit 612 in the form of metal grids have the advantages of small resistance, small thickness, and fast response speed.

Referring to FIG. 5 and FIG. 6, the second touch unit 612 has a linear shape extending along the first direction X, and the plurality of second touch units 612 are sequentially arranged along the second direction Y. The first touch unit 611 has a linear shape extending along the second direction Y, and the plurality of first touch units 611 are sequentially arranged along the first direction X. Each first touch unit 611 may include a plurality of first touch electrodes 6111 and a first connection part 6112 sequentially arranged along the second direction Y. The plurality of first touch electrodes 6111 are arranged at intervals, and adjacent first touch electrodes 6111 are connected to each other through the first connection part 6112. Each second touch unit 612 may include a plurality of second touch electrodes 6121 and a second connection part 6122 sequentially arranged along the first direction X. The plurality of second touch electrodes 6121 are arranged at intervals, and adjacent second touch electrodes 6121 are connected to each other through the second connection part 6122.

In some embodiments, as shown in FIG. 5 and FIG. 6, the first touch electrode 6111, the second touch electrode 6121 and the second connection part 6122 are provided in the same layer and can be formed through a single patterning process. The second touch electrode 6121 and the second connection part 6122 are of an integrated structure, the first connection part 6112 may be disposed on a bridge layer to form a bridge structure, and the touch insulation layer 52 is disposed between the first connection part 6112 and the second connection part 6122.

For example, referring to FIG. 6, the second touch layer 53 may include the first touch electrode 6111, the second touch electrode 6121 (not shown in the drawings) and the second connection part 6122. The second touch electrode 6121 and the second connection part 6122 are connected as a whole in the second touch layer 53. Furthermore, a gap is provided between the first touch electrode 6111 and both the second touch electrode 6121 and the second connection part 6122, and the gap may be formed by disconnection of a metal line. The first touch layer 51 may include the first connection part 6112, which is connected to two adjacent first touch electrodes 6111 through via holes provided on the touch insulation layer 52, so as to connect the plurality of first touch electrodes 6111 sequentially arranged along the second direction Y into one piece.

Since the driving backplane 22 needs to be connected to electrical signals, the first touch electrode 6111, the second touch electrode 6121 and the second connection part 6122 also need to be connected to electrical signals. The first touch electrode 6111, the second touch electrode 6121 and the second connection part 6122 are further away from the driving backplane 22 relative to the first touch layer 51, thereby reducing the electric signal interference between the driving backplane 22 and each of the first touch electrode 6111, the second touch electrode 6121 and the second connection part 6122, and ensuring the display effect and touch effect of the display panel 100. Alternatively, in some other embodiments of this disclosure, the first touch layer 51 may also include the first touch electrode 6111, the second touch electrode 6121 and the second connection part 6122, and the second touch layer 53 may also include the first connection part 6112.

In some other embodiments, the first touch electrode 6111, the first connection part 6112 and the second touch electrode 6121 are arranged in the same layer and can be formed through a single patterning process. The first touch electrode 6111 and the first connection part 6112 are formed in an integral structure, the second connection part 6122 may be provided on the bridge layer to form a bridge structure, and an insulation layer is provided between the first connection part 6112 and the second connection part 6122.

For example, the second touch layer 53 may include the first touch electrode 6111, the second touch electrode 6121, and the first connection part 6112. The first touch electrode 6111 and the first connection part 6112 are connected into one piece within the second touch layer 53. Furthermore, a gap is provided between the second touch electrode 6121 and both the first touch electrode 6111 and the first connection part 6112, and the gap is achieved by disconnection of the metal grid. The first touch layer 51 may include the second connection part 6122, which is connected to two adjacent second touch electrodes 6121 through fourth via holes provided on the touch insulation layer 52, so as to connect the plurality of second touch electrodes 6121 arranged sequentially along the first direction X into one piece. Alternatively, in some other embodiments of this disclosure, the first touch layer 51 may also include the first touch electrode 6111, the second touch electrode 6121 and the first connection part 6112, and the second touch layer 53 may also include the second connection part 6122.

In some embodiments, the first touch electrode 6111 and the second touch electrode 6121 may have a rhombus shape, for example, a regular rhombus shape, a transverse rhombus shape (longer in the transverse direction), or a longitudinal rhombus shape (longer in the longitudinal direction). In some embodiments, the first touch electrode 6111 and the second touch electrode 6121 may have any one or more of triangles, squares, trapezoids, parallelograms, pentagons, hexagons and other polygons, which are not limited in this disclosure.

In the side area CB, a touch lead 62 is provided. The touch lead 62 may include a first touch sub-lead, or a second touch sub-lead, or a first touch sub-lead and a second touch sub-lead that are stacked and connected. In other words, the touch lead 62 may be a single-layer structure including only the first touch sub-lead or the second touch sub-lead. The touch lead 62 may also include a stacked double-layer structure of the first touch sub-lead and the second touch sub-lead, in which the first touch sub-lead and the second touch sub-lead are connected. The first touch layer may include the first touch sub-lead, that is, the first touch sub-lead is disposed on the first touch layer; the second touch layer may include the second touch sub-lead, that is, the second touch sub-lead is disposed on the second touch layer.

Referring to FIG. 5, the touch lead 62 may include a first touch lead 621 and a second touch lead 622 (for clarity, different line types in the drawings are used to distinguish different leads).

First ends of a part of the first touch leads 621 are respectively connected to one end of the first touch unit 611, and second ends of these first touch leads 621 are led out to the bonding pins 15 and connected to the bonding pins 15. First ends of another part of the first touch leads 621 are respectively connected to the opposite end of the first touch unit 611, and second ends of the another part of the first touch lead 621 are led to the bonding pins 15 and connected to the bonding pins 15.

In some embodiments, when touch control can be achieved by fingers, the first touch electrode 6111 may be a driving electrode, and the second touch electrode 6121 may be a sensing electrode. Alternatively, the first touch electrode 6111 may be a sensing electrode, and the second touch electrode 6121 may be a driving electrode. A plurality of first touch units 611 and a plurality of second touch units 612 constitute (M rows of driving electrodes*N columns of sensing electrodes). In other words, M first touch units 611 and N second touch units 612 are included, where M and N are positive integers greater than two.

Referring to FIG. 5, the first end of the second touch lead 622 is connected to one end of the second touch unit 612, and the second end of the second touch lead 622 is led to the bonding pin 15 and is connected to the bonding pin 15. This wiring mode can also be called 2T1R (in which the first touch unit 611 is a touch driving unit, and the second touch unit 612 is a touch sensing unit). Alternatively, it can also be 1T2R (in which the first touch unit 611 is a touch sensing unit, and the second touch unit 612 is a touch driving unit).

It can be understood that the first touch electrodes 6111 in the same row are arranged sequentially along the second direction Y (the length direction of the display area AA). The number of first touch electrodes 6111 included in a row of first touch units 611 is relatively large. The touch signal starts from the first touch electrode 6111 coupled to the first touch lead 621 and is transmitted sequentially, in a direction away from the first touch lead 621, along a row of first touch electrodes 6111. However, as the transmission distance increases, the touch signal will gradually attenuate. In view of this, when the number of first touch electrodes 6111 is large, both ends of the same row of first touch electrodes 6111 are coupled to the first touch lead 621 respectively, thereby ensuring that the touch signal received by the first touch electrode 6111, which is farthest from the first touch lead 621 in a row of first touch electrodes 6111, is not attenuated and, thus ensuring that the touch signals on multiple first touch electrodes 6111 in a row are basically the same, so touch noise can be reduced.

In some other embodiments, the first touch lead 621 may also have only one connection mode, that is, only one end of the first touch unit 611 is connected to the first touch lead 621. This wiring mode is called 1T1R.

Alternatively, in some other embodiments of this disclosure, the second touch leads 622 may be configured in two parts. The first ends of one part of the second touch leads 622 are connected correspondingly to one ends of the second touch units 612, and the second ends of these second touch leads 622 are led out to the bonding pin 15 and connected with the bonding pin 15. The first ends of another part of the second touch leads 622 are connected to the opposite ends of the second touch units 612, and the second ends of the another part of the second touch leads 622 are led out to the bonding pin 15 and connected with the bonding pin 15.

This wiring mode can also be called 2T2R, which can ensure that, among a row of touch electrodes coupled to the touch leads, the touch signals received by the touch electrodes that are relatively farther away from the touch leads 62 are almost the same as that received by the touch electrodes that are relatively closer to the touch leads 62, thereby ensuring the touch accuracy of a relatively large touch screen.

Referring to FIG. 4, a first optical functional layer 71 is provided on the side of the second touch layer 53 away from the base substrate 1, and a second optical functional layer 72 is provided on a side of the first optical functional layer 71 away from the base substrate 1.

In the display area AA, the first optical function layer 71 has an optical pattern 711. Specifically, a plurality of recessed parts may be provided on the side of the first optical function layer 71 away from the base substrate 1, that is, the optical pattern 711 may include a plurality of recessed parts. The recessed part may include side walls and a bottom wall, where the bottom wall is parallel to the display surface, and the side walls intersect the display surface. There is a one-to-one correspondence between the recessed parts and the sub-pixels 35. Specifically, the number of the recessed parts is the same as the number of the sub-pixels 35, and the shape of the recessed parts is the same as the shape of the sub-pixels 35. For example, when the sub-pixels 35 are formed in a circular shape, the recessed parts are also formed to be circular; when the sub-pixels 35 are formed to be rectangular, the recessed parts are also formed to be rectangular. Alternatively, in some other embodiments of this disclosure, the shape of the sub-pixels 35 and the shape of the recessed parts may also be other shapes, which will not be elaborated here.

Figure 22:
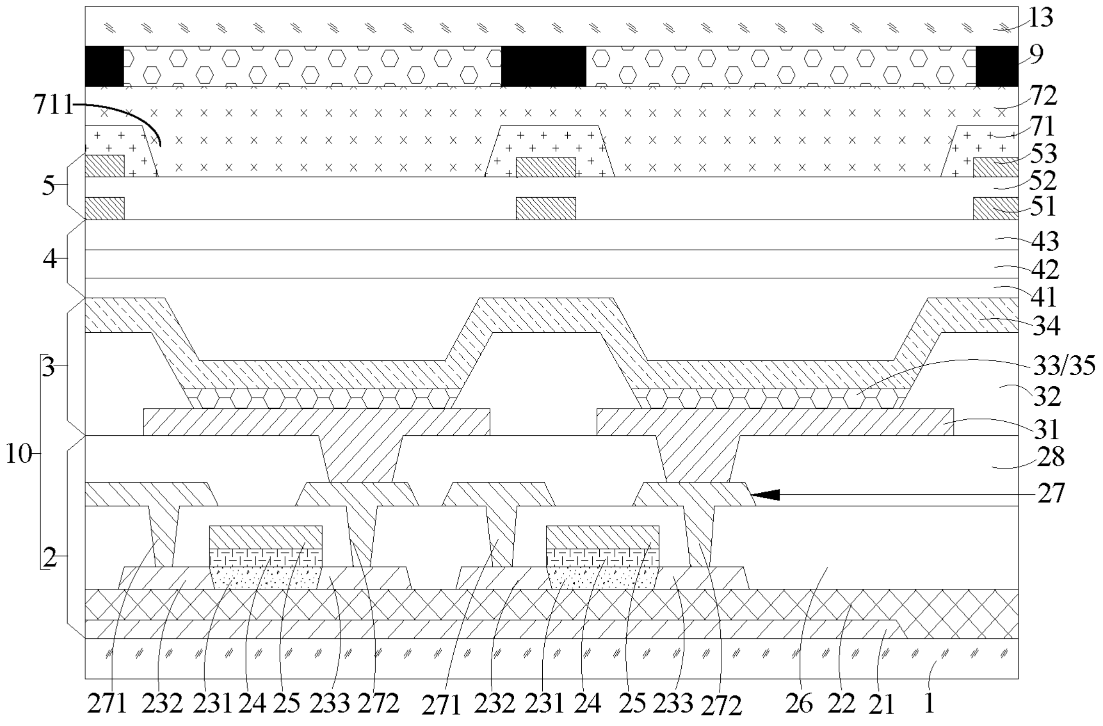
FIG. 22 is a schematic structural diagram illustrating the display area of the display panel according to some other embodiments of this disclosure.

As shown in FIG. 22, the optical pattern 711 (recessed part) may include via holes that penetrate the first optical functional layer 71. As shown in FIG. 4, the optical pattern 711 (recessed part) may include blink holes without penetrating the first optical functional layer 71.

Referring to FIG. 4, the orthographic projection of the recessed part on the display substrate 10 covers the sub-pixel 35, that is, the edge of the orthographic projection of the recessed part on the display substrate 10 may coincide with the edge of the sub-pixel 35; or the orthographic projection of the recessed part on the display substrate 10 has a larger area than the sub-pixel 35.

The second optical functional layer 72 is disposed on the side of the first optical functional layer 71 away from the base substrate 1. At least part of the second optical functional layer 72 is disposed in the recessed part. The refractive index of the second optical functional layer 72 is the different from that of the first optical functional layer 71. For example, the refractive index of the second optical functional layer 72 may be greater than the refractive index of the first optical functional layer 71. In this way, a total reflection is prone to occur at the interface between the second optical functional layer 72 and the side walls of the recessed part. The side walls of the recessed part will cause total reflection of the inclined outgoing light to form total reflected light and change the angle of the outgoing light, so that the total reflected light is more concentrated and emitted from the front of the display panel 100, thereby improving the light extraction efficiency at the front of the display panel 100, reducing the light extraction efficiency at the side surface of the display panel 100, and increasing the anti-peeping effect.

Alternatively, the refractive index of the second optical functional layer 72 may be smaller than the refractive index of the first optical functional layer 71, so refraction may occur at the interface between the second optical functional layer 72 and the side walls of the recessed part, and the refraction angle is smaller than the incident angle. In this way, the angle of the outgoing light is also changed, so that the total reflected light is relatively concentrated and emitted from the front of the display panel 100, thereby improving the light extraction efficiency at the front of the display panel 100, reducing the light extraction efficiency at the side surface of the display panel 100, and increasing the anti-peeping effect.

The thickness of the second optical functional layer 72 is greater than the thickness of the first optical functional layer 71. The thickness of the second optical functional layer 72 is greater than or equal to 3 microns and less than or equal to 5 microns. For example, the thickness of the second optical functional layer 72 may be 3.2 microns, 3.5 microns, 3.8 microns, 4.15 microns, 4.56 microns, 4.88 microns, etc. The thickness of the first optical functional layer 71 is greater than or equal to 1.5 microns and less than or equal to 2.5 microns. For example, the thickness of the first optical functional layer 71 may be 1.7 microns, 1.9 microns, 2.1 microns, 2.25 microns, 2.45 microns, etc.

During the preparation process of the display panel 100, multiple display panels 100 may be prepared on a larger motherboard, and then multiple display panels 100 may be formed through cutting along the cutting channel 14. The materials of the first optical functional layer 71 and the second optical functional layer 72 are both organic insulation material(s). Carbon ash may easily be generated during cutting process of the organic insulation material, which may lead to connection of two adjacent wires of the display panels 100, thereby resulting in poor display. Therefore, the first optical functional layer 71 and the second optical functional layer 72 are not provided at the cutting channel 14. However, if the first optical functional layer 71 and the second optical functional layer 72 are not provided, bubbles may easily be generated by the protective film at the cutting channel 14 after the protective film is attached during the preparation process.

The inventor found that the main reason, why bubbles are easily generated by the protective film at the cutting channel 14, lies in that the step difference formed by the stacking of the first optical functional layer 71 and the second optical functional layer 72 is relatively large. For example, the step difference can reach 5.6 microns, making bubbles likely occur at the cutting channel 14 after applying the protective film.

In some embodiments, as shown in FIG. 7, the non-zero first distance D1 is provided between the edge line of the first optical functional layer 71 close to the cutting channel 14 and the cutting channel 14, that is, the first optical functional layer 71 does not extend from the display area AA to the cutting channel 14, and the first optical functional layer 71 is spaced apart from the cutting channel 14.

The second optical functional layer 72 covers the optical pattern 711 of the first optical functional layer 71 and extends to the side of the substrate 1 close to the cutting channel 14. Specifically, the second optical functional layer 72 covers the first optical functional layer 71 in the display area AA, and the second optical functional layer 72 is also disposed in the recessed part of the first optical functional layer 71. In the non-display area NA, the second optical functional layer 72 covers the sidewall of the first optical functional layer 71 and extends to the base substrate 1, and a non-zero second distance D2 is provided between the edge line of the second optical function layer 72 close to the cutting channel 14 and the cutting channel 14, that is, the second optical function layer 72 does not extend from the display area AA to the cutting channel 14, and the second optical functional layer 72 is spaced apart from the cutting channel 14. The first distance D1 is greater than the second distance D2, that is, the second optical functional layer 72 completely covers the first optical functional layer 71.

In the part where the second optical functional layer 72 protrudes from the first optical functional layer 71, there is only one layer of the second optical functional layer 72. Since the step difference produced by the second optical functional layer 72 is small, after the protective film is attached, it is not easy for bubbles to be caused by only the thickness of the second optical functional layer 72. Moreover, since the materials of the first optical functional layer 71 and the second optical functional layer 72 are both organic insulation materials and have good fluidity, arc shapes can be formed at the edge of the side wall of the first optical functional layer 71, as well as at the part of the second optical functional layer 72 covering the side wall of the first optical functional layer 71, and at the edge of the side wall of the second optical functional layer 72. This arrangement makes the step difference of the second optical functional layer 72 be relatively smooth, so bubbles are less likely to appear after the protective film is attached.

In this case, the difference C1 between the first distance D1 and the second distance D2 is greater than or equal to 30 microns, so that the second optical functional layer 72 can cover the first optical functional layer 71 well, and the step difference formed by the second optical functional layer 72 is relatively small and smooth.

In addition, since the width of the non-display area of the display panel is limited, the difference C1 between the first distance D1 and the second distance D2 is less than or equal to 70 microns, that is, the width of the part of the second optical functional layer 72 protruding beyond the first optical functional layer 71 is greater than or equal to 30 microns and less than or equal to 70 microns. For example, the difference between the first distance and the second distance may be 33 microns, 36.7 microns, 43.2 microns, 48 microns, 50 microns, 52 microns, 57.8 microns, 63.4 microns, 68.5 microns, etc.

In addition, the first distance is greater than or equal to 80 microns and less than or equal to 140 microns. For example, the first distance may be 83 microns, 86.7 microns, 93.2 microns, 98 microns, 102 microns, 107.8 microns, 113.4 microns, 118.5 microns, 122 microns, 127.5 microns, 132.4 microns, 138.7 microns, etc.

The second distance is greater than or equal to 50 microns and less than or equal to 90 microns. For example, the second distance may be 52 microns, 57.8 microns, 63.4 microns, 68.5 microns, 73.2 microns, 78 microns, 83 microns, 86.7 microns, etc.

Alternatively, the above data may vary depending on the product and the equipment process.

Figure 8:
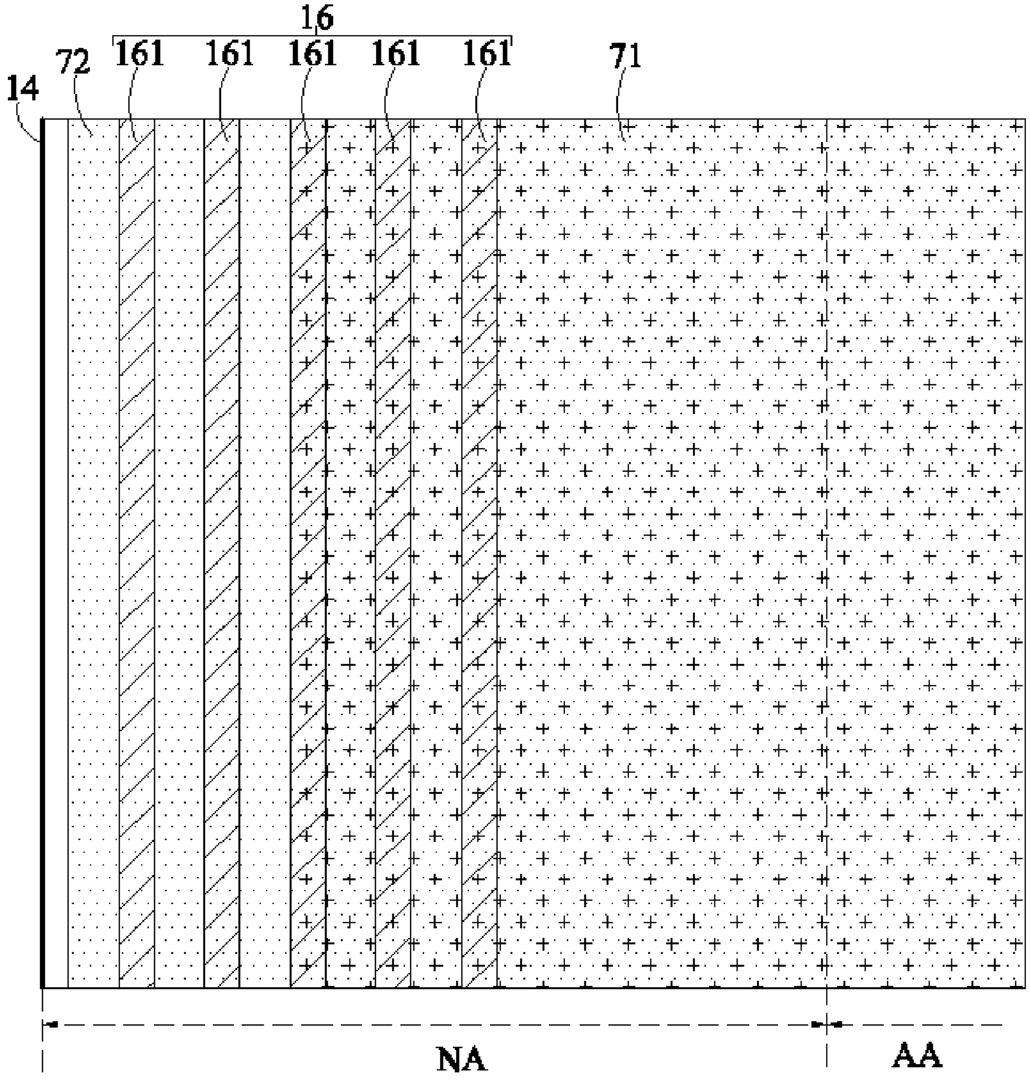
FIG. 8 is a schematic structural diagram of the crack blocking structure, the first optical functional layer and the second optical functional layer in the display panel of this disclosure.
Figure 9:
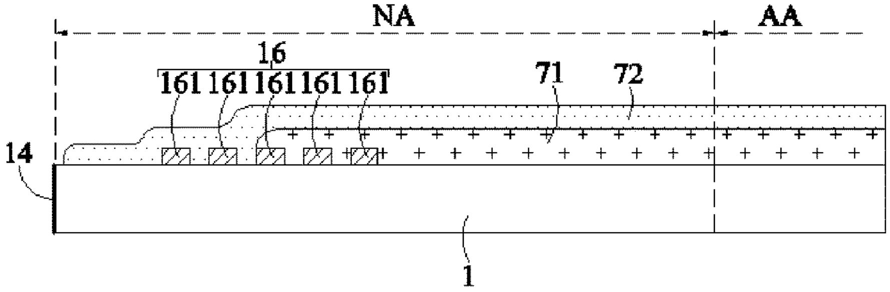
FIG. 9 is a schematic cross-sectional view of FIG. 8.

In some embodiments of this disclosure, as shown in FIG. 8 and FIG. 9, the display panel 100 may further include a crack blocking structure 16 disposed on a side of the cutting channel 14 close to the display area AA. The crack blocking structure 16 is disposed in the non-display area NA, and is disposed closer to the cutting channel 14 than to the display area AA. Specifically, the crack blocking structure 16 may be an annular shape surrounding the cutting channel 14, and the crack blocking structure 16 may include a plurality of blocking rings 161 that are nested in sequence. The first optical functional layer 71 covers a part of the crack blocking structure 16 close to the display area AA. The first optical functional layer 71 extends from the display area AA to the crack blocking structure 16 and covers a part of the blocking rings 161 of the crack blocking structure 16 close to the display area AA, but does not cover another part of the blocking ring 161 close to the cutting channel 14. The second optical functional layer 72 covers the entire crack blocking structure 16, that is, the second optical functional layer 72 covers the entire blocking ring 161. When the motherboard is cut to form multiple display panels 100, cracks will occur around the cutting channel 14. The crack blocking structure 16 can prevent the cracks from further extending to the side of the display area AA, thereby ensuring that the film layer of the display area AA is not damaged, and ensuring that various leads located on the side of the crack blocking structure 16 close to the display area AA are not damaged.

The crack blocking structure 16 and the interlayer dielectric layer 26 may be provided in the same layer and with the same material, that is, the crack blocking structure 16 and the interlayer dielectric layer 26 may be formed through the same patterning process. In addition, the encapsulation layer group 4 may also cover a part of the crack blocking structure 16 close to the display area AA.

Figure 10:
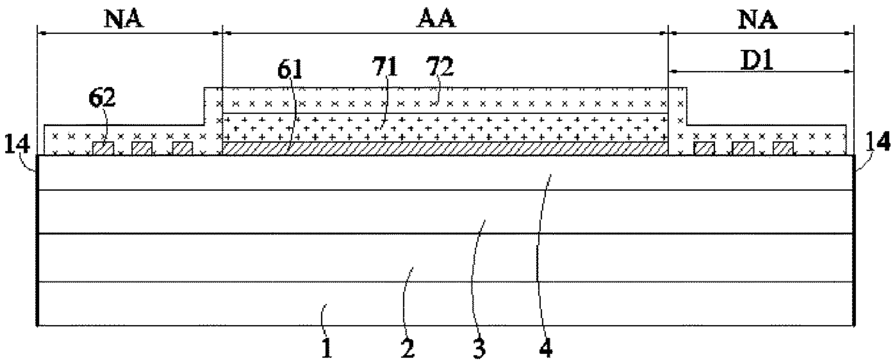
FIG. 10 is a schematic structural diagram of the display panel according to some other embodiments of this disclosure.
Figure 11:
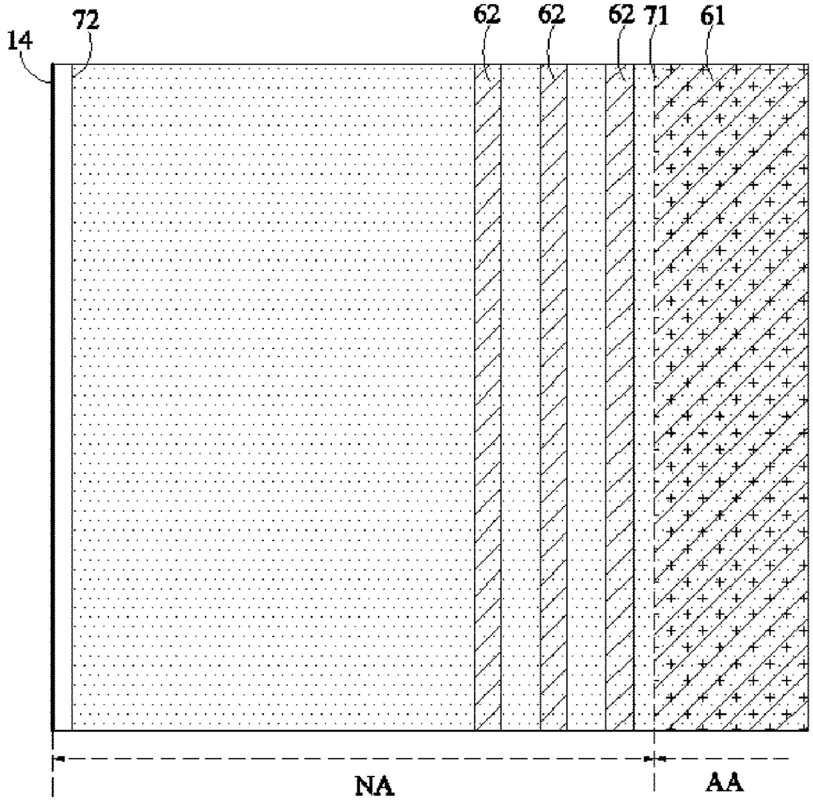
FIG. 11 is a partial top view of FIG. 10.

In some embodiments of this disclosure, as shown in FIG. 10 and FIG. 11, the first distance D1 is substantially equal to the distance between the edge line of the display area AA close to the cutting channel 14 and the cutting channel 14, that is, the distance between the edge line of the first optical function layer 71 close to the cutting channel 14 and the cutting channel 14 is equal to the distance between the edge line of the display area AA close to the cutting channel 14 and the cutting channel 14. In other words, the first optical functional layer 71 is only provided in the display area AA, but is not provided in the non-display area NA. The second optical functional layer 72 extends to the edge of the cutting channel 14 close to the display area AA, that is, the second optical functional layer 72 is provided in both the display area AA and the non-display area NA.

With this arrangement, the step difference caused by the first optical function layer 71 at the edge of the display panel 100 can be completely eliminated. However, when the first optical functional layer 71 is formed by exposing and developing the first optical function material layer to remove the material in the non-display area NA, the developer may corrode the leads of the second touch layer 53, thereby causing the touch lead 62 to be disconnected or have excessive resistance and, thus, affecting the touch effect.

Figure 12:
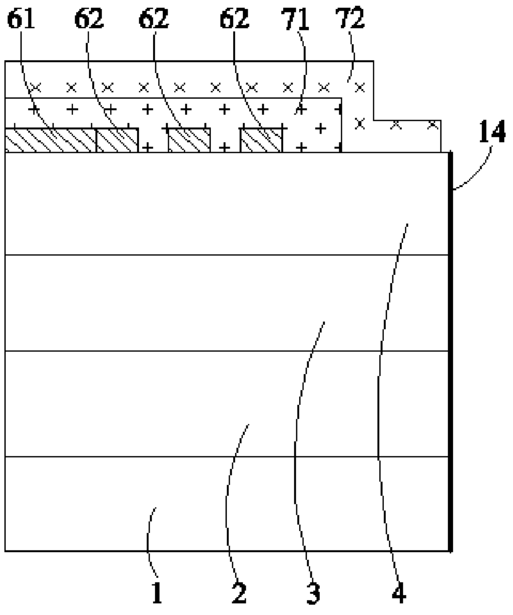
FIG. 12 is a schematic structural diagram of the touch lead, the first optical functional layer and the second optical functional layer in the display panel according to some embodiments of this disclosure.
Figure 13:
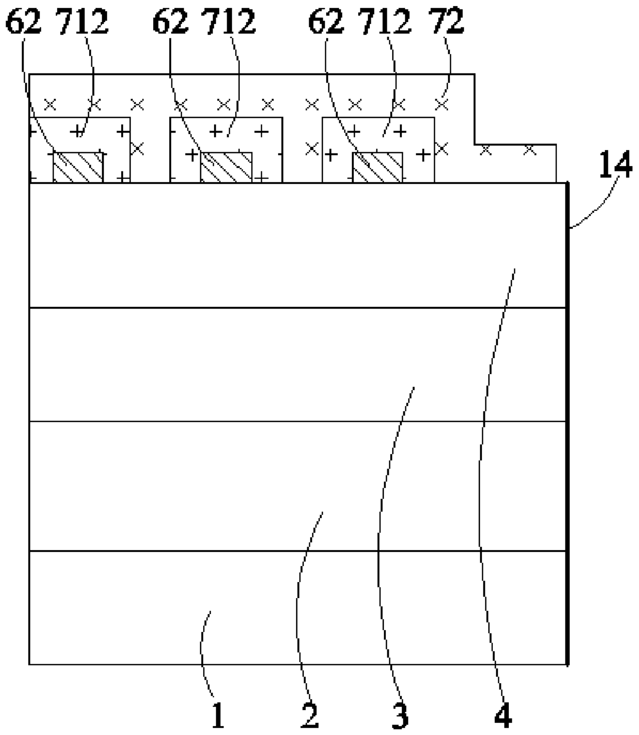
FIG. 13 is a schematic structural diagram of the touch lead structure, the first optical functional layer and the second optical functional layer in the display panel according to some other embodiments of this disclosure.
Figure 14:
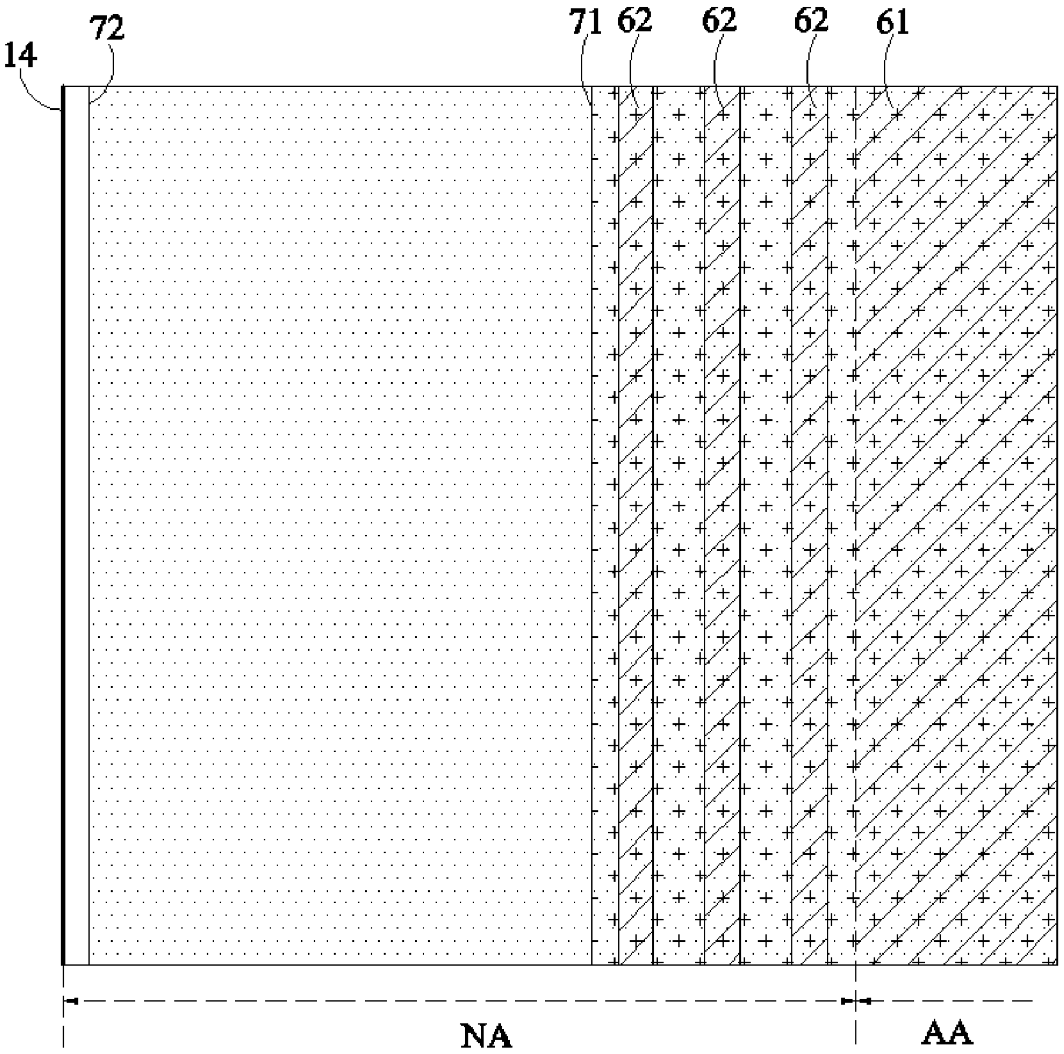
FIG. 14 is a schematic top view of FIG. 12.

In order to solve the above problem, as shown in FIG. 12 to FIG. 14, the touch lead 62 can be covered with the first optical functional layer 71, that is, the first optical functional layer 71 is also provided in the non-display area NA. The first optical functional layer 71 in the non-display area NA may only cover the touch lead 62. As shown in FIG. 12 and FIG. 14, the first optical functional layer 71 can be provided as a whole layer, extending from the display area AA to the touch lead 62 at the outermost side of the non-display area NA. The first optical functional layer 71 covers the outermost touch lead 62, but is not provided in the part of the non-display area NA where the touch lead 62 faces away from the display area AA. Alternatively, in some other embodiments of this disclosure, as shown in FIG. 13, the first optical functional layer 71 may include an optical functional part and a plurality of covering parts 712, where the optical functional part is located in the display area AA, and the covering parts 712 are located in the non-display area NA. Two adjacent covering parts 712 are arranged at intervals, with each covering part 712 covers one touch lead 62.

After covering the touch leads 62 with the first optical functional layer 71, when the first optical functional material layer is exposed and developed to remove the material in the non-display area NA, the developer will not cause corrosion on the touch leads 62 of the second touch layer 53, thereby ensuring that the touch leads 62 will not be disconnected or have excessive resistance and, thus, preventing the touch effect from being affected. Moreover, since the touch lead 62 is still a certain distance away from the cutting channel 14, the covering parts 712 will not produce a step difference at the edge of the display panel 100, so no bubbles will be generated after the protective film is attached.

Figure 15:
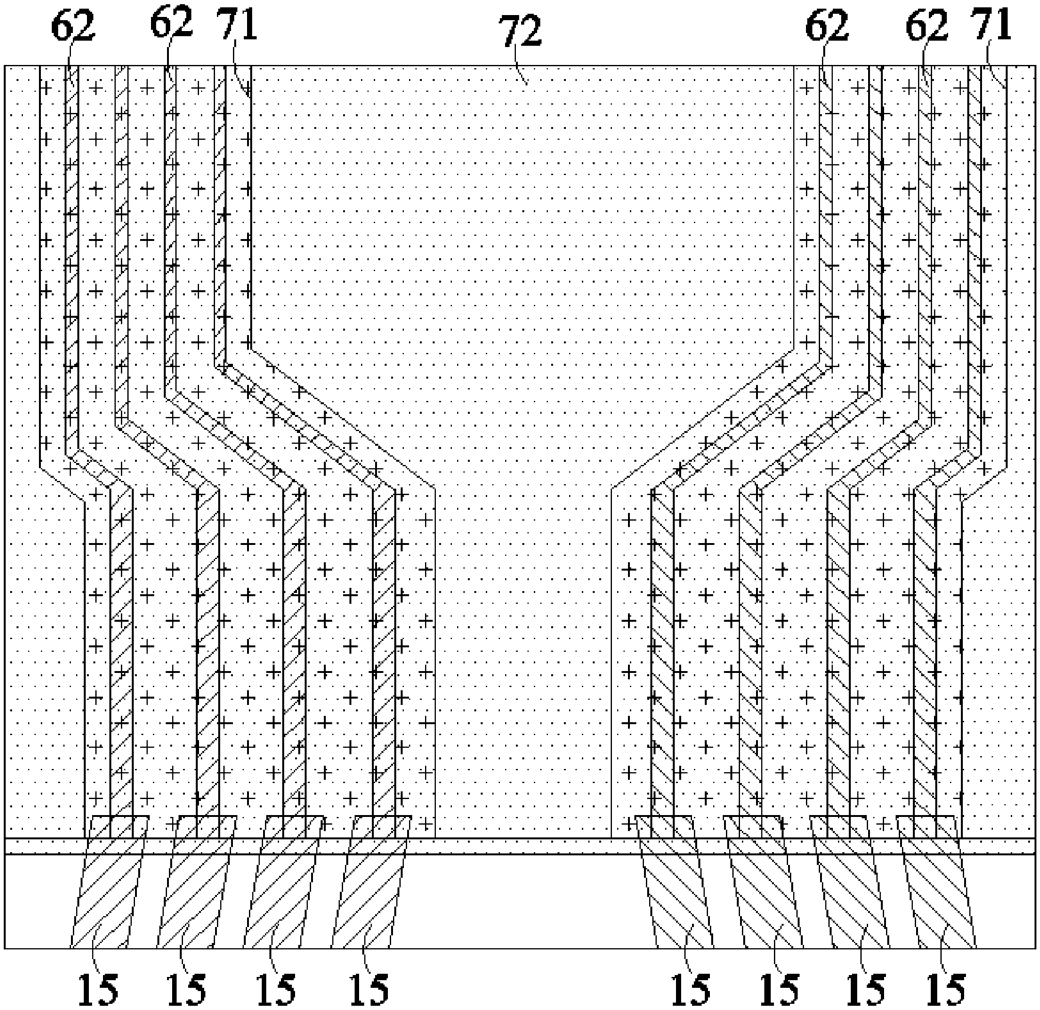
FIG. 15 is a schematic structural diagram of the non-display area on the side of the display panel close to the bonding pins of this disclosure.

Furthermore, as shown in FIG. 15, in the non-display area NA on the side of the display panel 100 close to the bonding pin 15, that is, in the non-display area NA on the side close to the bonding area BOD, the first optical functional layer 71 only covers the touch lead 62. In other words, only the part of the first optical functional layer 71 covering the touch lead 62 is retained, the other parts of the first optical functional layer 71 are removed, and the second optical functional layer 72 is retained completely. For example, when two touch leads 62 are provided, the first optical functional layer 71 is not provided between the two adjacent touch leads 62, and is not provided on the side of a touch lead 62 away from the other touch lead 62.

Figure 16:
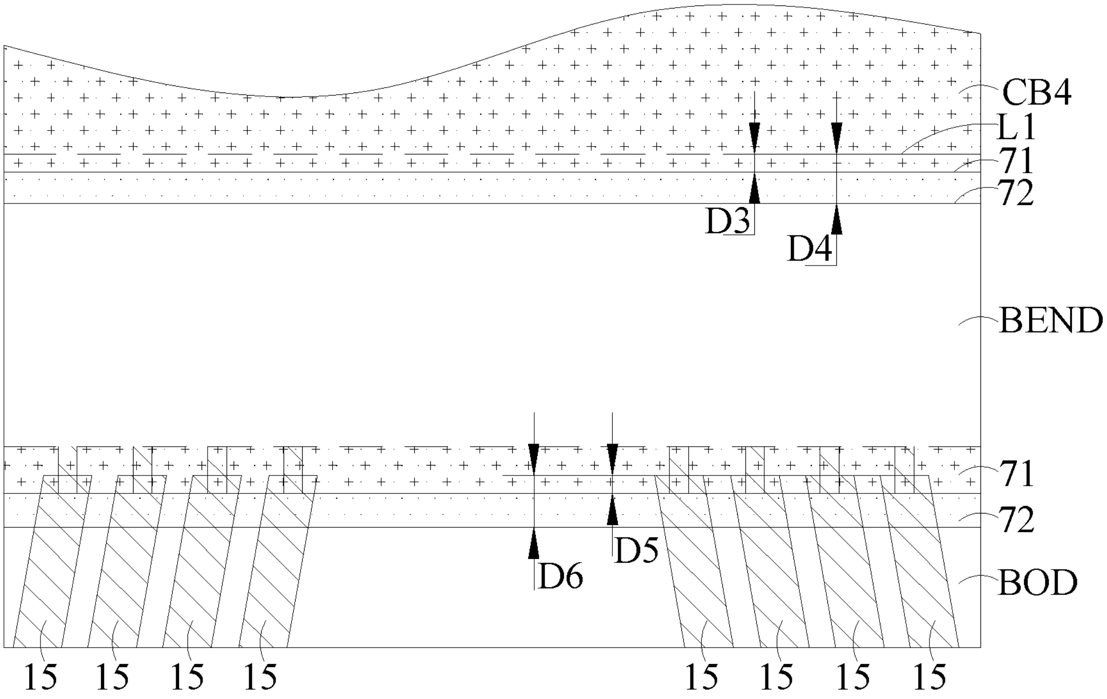
FIG. 16 is a schematic structural diagram of the first optical functional layer and the second optical functional layer in the bending area of the display panel according to some embodiments of this disclosure.

In some embodiments of this disclosure, referring to FIG. 16, in which the fourth side area CB4, the bending area BEND and the bonding area BOD are divided by dotted lines, both the first optical functional layer 71 and the second optical functional layer 72 extend into the bending area BEND. The edge line of the bending area BEND close to the display area AA is marked as the first edge line L1. A non-zero third distance D3 is provided between the edge line of the first optical functional layer 71 close to the first edge line L1 and the first edge line L1, and a non-zero fourth distance D4 is provided between the edge line of the second optical function layer 72 close to the first edge line L1 and the first edge line L1, where the fourth distance D4 is greater than the third distance D3, that is, the width of the second optical function layer 72 extending into the bending area BEND is greater than the width of the first optical function layer 71 extending into the bending area BEND. Most part of the first optical functional layer 71 and the second optical functional layer 72 in the bending area BEND are removed, so that the thickness of the display panel 100 in the bending area BEND is relatively thin, which is beneficial to the bending of the display panel 100. Moreover, the step structure in which the second optical functional layer 72 covers the first optical functional layer 71 is beneficial to reducing bending stress and ensuring the display effect of the display panel 100.

Specifically, if the difference between the fourth distance D4 and the third distance D3 is greater than or equal to 5 microns, the second optical functional layer 72 can cover the first optical functional layer 71 well, and the step difference formed by the second optical functional layer 72 is relatively small and smooth.

In addition, in order to prevent the second optical function layer 72 from extending too far into the bending area BEND and affecting the bending of the display panel 100, the difference between the fourth distance and the third distance is less than or equal to 15 microns. For example, the difference between the fourth distance D4 and the third distance D3 may be 5.3 microns, 5.7 microns, 6.2 microns, 6.8 microns, 7.1 microns, 7.8 microns, 8.4 microns, 8.8 microns, 9.2 microns, 9.8 microns, 10 microns, 10.8 micron, 11.4 micron, 12.8 micron, 13.7 micron, 14.5 micron and so on.

In addition, the third distance D3 may be greater than or equal to 3 microns and less than or equal to 8 microns. For example, the third distance may be 3.3 microns, 3.7 microns, 4.2 microns, 4.8 microns, 5.1 microns, 5.8 microns, 6.4 microns, or 6.8 microns. micron, 7.2 microns, 7.8 microns and so on.

The fourth distance D4 may be greater than or equal to 8 microns and less than or equal to 23 microns. For example, the fourth distance may be 8.3 microns, 8.7 microns, 9.2 microns, 9.8 microns, 10.1 microns, 10.8 microns, 11.4 microns, 11.8 microns, 12.2 microns, 12.8 microns, 13.7 microns, 14.2 microns, 15.8 microns, 16.1 microns, 17.8 microns, 18.4 microns, 19.8 microns, 20.2 microns, 21.8 microns, 22.5 microns and so on.

Figure 17:
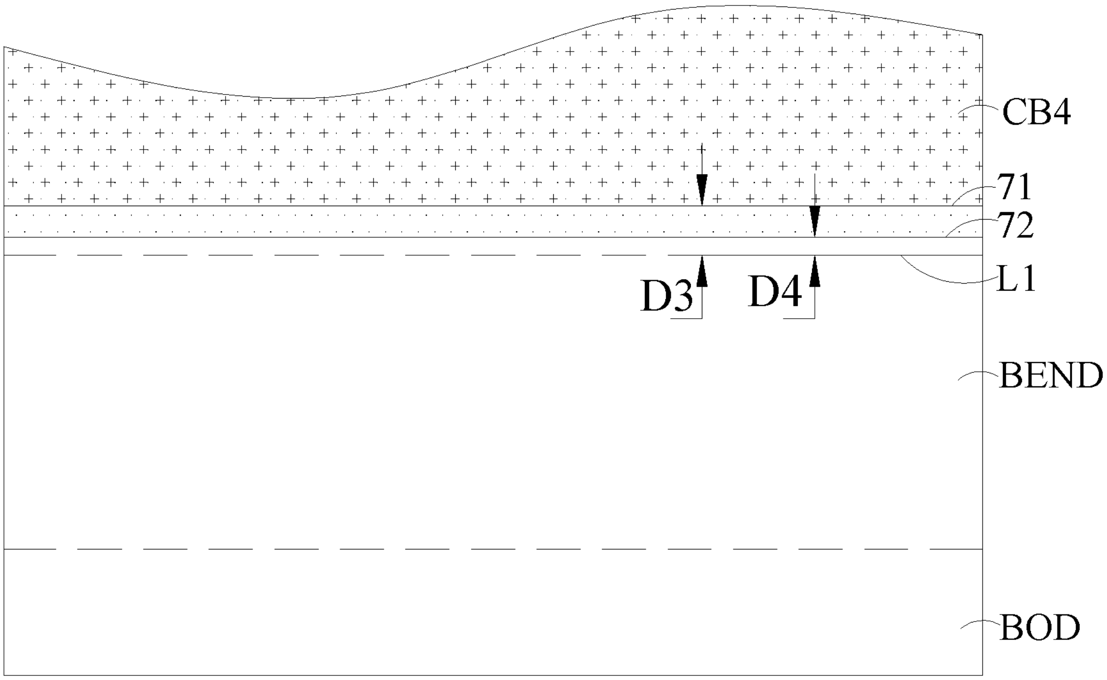
FIG. 17 is a schematic structural diagram of the first optical functional layer and the second optical functional layer in the bending area of the display panel according to some other embodiments of this disclosure.

Alternatively, in some other embodiments of this disclosure, with reference to FIG. 17, in which the fourth side area CB4, the bending area BEND and the bonding area BOD are divided by dotted lines, the first optical functional layer 71 and the second optical functional layer 72 may extend to the side of the bending area BEND close to the display area AA, that is, the first optical functional layer 71 and the second optical functional layer 72 do not extend into the bending area BEND. In other words, the first optical functional layer 71 and the second optical functional layer 72 may extend to an edge line at one side of the bending area BEND close to the display area AA. The edge line of the bending area BEND close to the display area AA is marked as the first edge line L1. A non-zero third distance D3 is provided between the edge line of the first optical function layer 71 close to the first edge line L1 and the first edge line L1. A non-zero fourth distance D4 is provided between the edge line of the second optical function layer 72 close to the first edge line L1 and the first edge line L1. The third distance D3 is greater than the fourth distance D4, that is, the distance between the second optical function layer 72 and the bending area BEND is smaller than the distance between the first optical functional layer 71 and the bending area BEND. The first optical functional layer 71 and the second optical functional layer 72 are removed in the bending area BEND, so that the thickness of the display panel 100 in the bending area BEND is relatively thin, which is beneficial to the bending of the display panel 100. Moreover, the step structure in which the second optical functional layer 72 covers the first optical functional layer 71 is beneficial to reducing bending stress and ensuring the display effect of the display panel 100.

Specifically, as long as the difference between the third distance D3 and the fourth distance D4 is greater than or equal to 5 microns, the second optical functional layer 72 can cover the first optical functional layer 71 well, and the step difference formed by the second optical functional layer 72 is relatively small and smooth.

In addition, in order to prevent the second optical function layer 72 from extending too long into the bending area BEND and affecting the bending of the display panel 100, the difference between the third distance D3 and the fourth distance D4 is less than or equal to 15 microns. For example, the difference between the third distance and the fourth distance may be 5.3 microns, 5.7 microns, 6.2 microns, 6.8 microns, 7.1 microns, 7.8 microns, 8.4 microns, 8.8 microns, 9.2 microns, 9.8 microns, 10 microns, 10.8 microns, 11.4 microns, 12.8 microns, 13.7 microns, 14.5 microns and so on.

In addition, the fourth distance D4 may be greater than or equal to 3 microns and less than or equal to 8 microns. For example, the third distance may be 3.3 microns, 3.7 microns, 4.2 microns, 4.8 microns, 5.1 microns, 5.8 microns, 6.4 microns, 6.8 microns, 7.2 microns, 7.8 microns and so on.

In addition, the third distance D3 may be greater than or equal to 8 microns and less than or equal to 23 microns. For example, the fourth distance may be 8.3 microns, 8.7 microns, 9.2 microns, 9.8 microns, 10.1 microns, 10.8 microns, 11.4 microns, 11.8 microns, 12.2 microns, 12.8 microns, 13.7 microns, 14.2 microns, 15.8 microns, 16.1 microns, 17.8 microns, 18.4 microns, 19.8 microns, 20.2 microns, 21.8 microns, 22.5 microns and so on.

Figure 18:
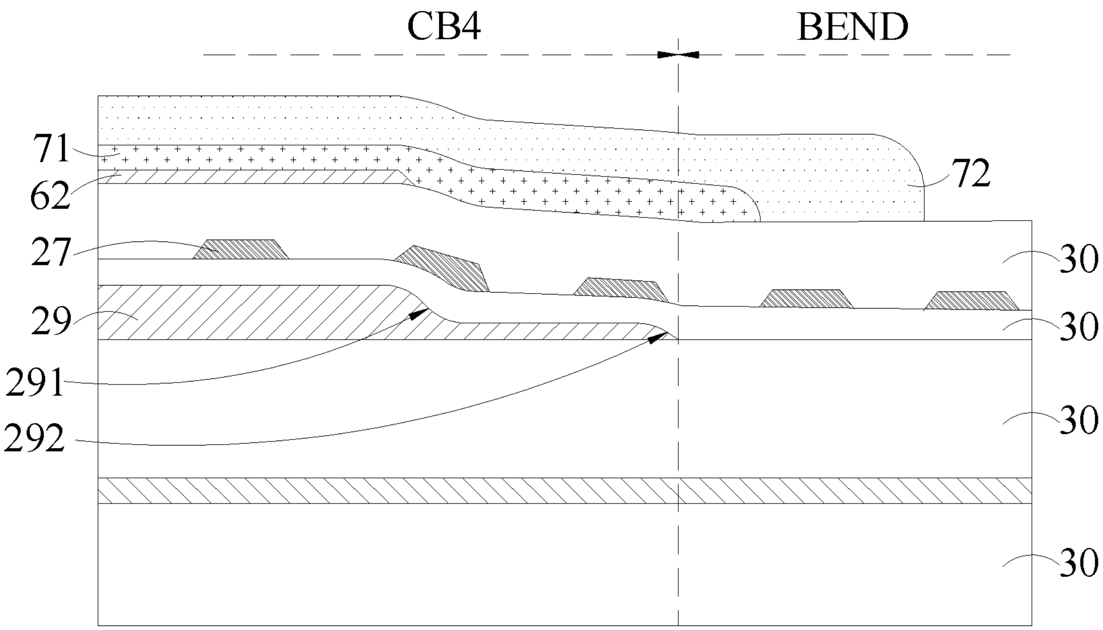
FIG. 18 is a schematic cross-sectional structural view illustrating the bending area of the display panel close to the side of the display panel according to this disclosure.

Referring to FIG. 18, the display panel 100 may further include a third inorganic layer 29 and an organic material layer 30. Specifically, the display substrate 10 may include the third inorganic layer 29 and the organic material layer 30. The third inorganic layer 29 is provided between the base substrate 1 and the light-emitting layer group 33, the third inorganic layer 29 and the organic material layer 30 are both insulation layers, which are insulation layers provided between the conductive layers. For example, the third inorganic layer 29 may include the interlayer dielectric layer 26, and the organic material layer 30 may include the buffer layer 22, the gate insulation layer 24, the planarization layer 28, and the like. Alternatively, the third inorganic layer 29 may also be other film layers, it may be provided as one layer, or as two or more layers; and the organic material layer 30 may also be other film layers.

Since inorganic materials are relatively brittle, they are prone to cracks during bending; while organic materials are soft and are not prone to cracks during bending. Therefore, the inorganic materials are to be removed in the bending area BEND, while the organic material layer 30 can be remained or partial film layer(s) thereof can be removed.

Two patterning processes can be adopted to remove the third inorganic layer 29 in the bending area BEND. For example, a first mask etching (referred to as Etch Bending A MASK, "EBA MASK" for short) is adopted to form the first groove 291 on the third inorganic layer 29. Then a second mask etching (referred to as Etch Bending B MASK, "EBB MASK" for short) is applied on the third inorganic layer 29 in the first groove 291 to form the second groove 292, so as to make the third inorganic layer 29 further thinned, and cause the third inorganic layer 29 in the bending area BEND to be completely etched away. In other words, the second groove 292 is a through groove penetrating the third inorganic layer 29, and the first groove 291 exposes the second groove 292 to form a stepped groove structure. The edge line of the second groove 292 is the edge line of the bending area BEND, so that the orthographic projection of the bending area BEND on the substrate 1 overlaps with the orthographic projection of the first groove 291 on the base substrate. For example, the orthographic projection of the first groove 291 on the base substrate covers the orthographic projection of the bending area BEND on the base substrate 1, the orthographic projection of the first groove 291 on the base substrate has a larger area than the orthographic projection of the bending area BEND on the base substrate 1, and the third inorganic layer 29 is not provided in the bending area BEND.

In addition, it should be noted that in FIG. 17, the first optical functional layer 71 and the second optical functional layer 72 may extend to the edge line on one side of the bending area BEND close to the display area AA. In other words, when the first optical functional layer 71 and the second optical function layer 72 do not extend into the bending area BEND, the orthographic projection of the first optical function layer 71 and the second optical function layer 72 on the base substrate 1 overlaps with the orthographic projection of the first groove 291 on the base substrate 1, that is, the orthographic projections of the edge lines of the first optical functional layer 71 and the second optical functional layer 72 close to the bending area BEND on the base substrate fall within the orthographic projection of the first groove 291 on the base substrate 1.

In some other embodiments of this disclosure, as shown in FIG. 16, the first optical functional layer 71 and the second optical functional layer 72 both extend to the side of the bonding pin 15 away from the base substrate 1, a non-zero fifth distance D5 is provided between the edge line of the optical functional layer 71 close to the bonding pin 15 and the bonding pin 15, and a non-zero sixth distance D6 is provided between the edge line of the second optical functional layer 72 close to the bonding pin 15 and the bonding pin 15, where the sixth distance D6 is greater than the fifth distance D5. The first optical functional layer 71 and the second optical functional layer 72 are removed at the bonding pin 15 so that the surface at the bonding pin 15 is relatively flat, which is beneficial to bonding the display panel 100 to the flexible circuit board. Moreover, the stepped structure configured as the second optical functional layer 72 covering the first optical functional layer 71 can reduce the step difference formed between the first optical functional layer 71 and the second optical functional layer 72. In this way, when the display panel 100 is bound to the flexible circuit board, the support of the first optical functional layer 71 and the second optical functional layer 72 to the flexible circuit board can be reduced, thereby ensuring good fit between the display panel 100 and the flexible circuit board and, thus, facilitating the bonding between the display panel 100 and the flexible circuit board, so as to ensure the display effect of the display panel 100.

Specifically, as long as the difference between the sixth distance D6 and the fifth distance D5 is greater than or equal to 5 microns, the second optical functional layer 72 can cover the first optical functional layer 71 well, and the step difference formed by the second optical functional layer 72 is relatively small and smooth.

In addition, in order to prevent the second optical functional layer 72 from extending too long to fall above the bonding pin 15 and affecting the bonding of the display panel 100, the difference between the sixth distance D6 and the fifth distance D5 is less than or equal to 15 microns. For example, the difference between the sixth distance and the fifth distance may be 5.3 microns, 5.7 microns, 6.2 microns, 6.8 microns, 7.1 microns, 7.8 microns, 8.4 microns, 8.8 microns, 9.2 microns, 9.8 microns, 10 microns, 10.8 microns, 11.4 microns, 12.8 microns, 13.7 microns, 14.5 microns and so on.

In addition, the fifth distance D5 may be greater than or equal to 3 microns and less than or equal to 8 microns. For example, the third distance may be 3.3 microns, 3.7 microns, 4.2 microns, 4.8 microns, 5.1 microns, 5.8 microns, 6.4 microns, or 6.8 microns, 7.2 microns, 7.8 microns and so on.

The sixth distance D6 may be greater than or equal to 8 microns and less than or equal to 23 microns. For example, the fourth distance may be 8.3 microns, 8.7 microns, 9.2 microns, 9.8 microns, 10.1 microns, 10.8 microns, 11.4 microns, 11.8 microns, 12.2 microns, 12.8 microns, 13.7 microns, 14.2 microns, 15.8 microns, 16.1 microns, 17.8 microns, 18.4 microns, 19.8 microns, 20.2 microns, 21.8 microns, 22.5 microns and so on.

Alternatively, in some other embodiments of this disclosure, neither the first optical function layer 71 nor the second optical function layer 72 extends to the side of the bonding pin 15 away from the substrate 1. In other words, there is no overlap between the orthographic projection of the second optical function layer 72 and the first optical functional layer 71 on the base substrate 1 and the orthographic projection of the bonding pin 15 on the base substrate 1. The first optical functional layer 71 and the second optical functional layer 72 extend to the edge of the bonding pin 15 close to the display area AA. The second optical functional layer 72 is configured to cover the first optical functional layer 71, and the specific size relationship will not be repeated here.

Figure 19:
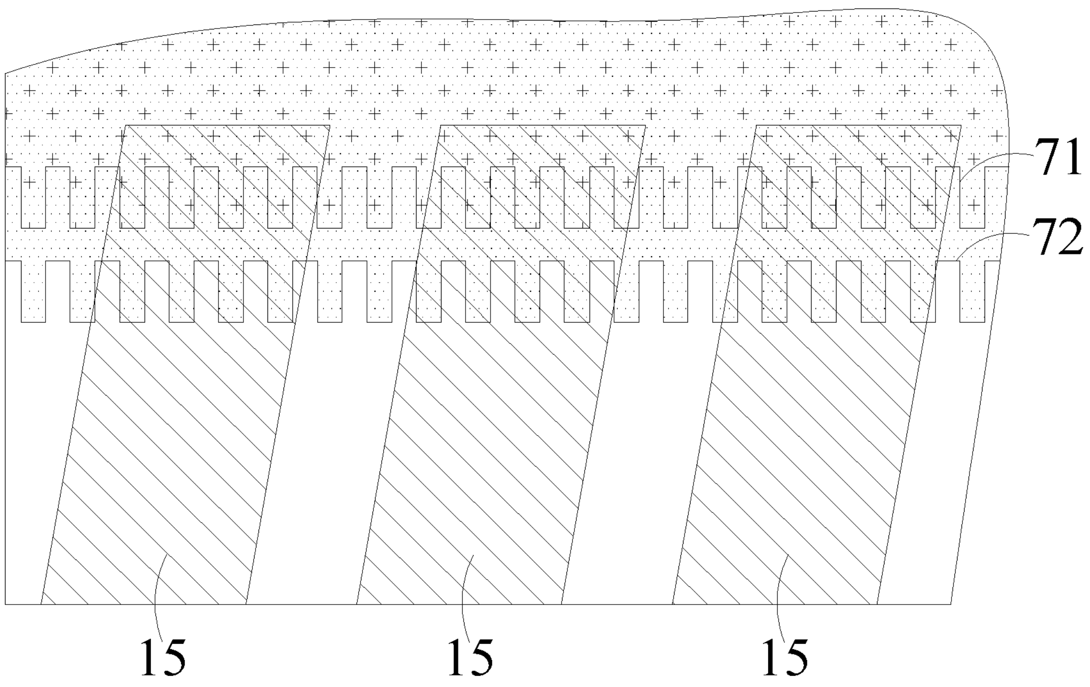
FIG. 19 is a schematic structural diagram of the first optical functional layer and the second optical functional layer in the display panel according to some other embodiments of this disclosure.

Further, as shown in FIG. 19, the orthographic projection of the edge line of the first optical function layer 71 on the base substrate 1 is configured as a curve. Specifically, the orthographic projection of the edge line of the first optical function layer 71 on the base substrate 1 may be in a rectangular zigzag shape. The orthographic projection of the edge line of the second optical functional layer 72 on the base substrate is configured as a curve. Specifically, the orthographic projection of the edge line of the second optical functional layer 72 on the configured substrate may be in a rectangular zigzag shape. Alternatively, in some other embodiments of this disclosure, the orthographic projection of the edge line of the first optical function layer 71 on the base substrate 1 may be configured as a sinusoidal curve, a triangular zigzag, a curve formed by multiple arcs in connection, a curve formed by arcs and straight lines in connection, or the like. Correspondingly, the orthographic projection of the edge line of the second optical function layer 72 on the base substrate may be configured as a sinusoidal curve, a triangular zigzag, a curve formed by multiple arcs in connection, a curve formed by arcs and straight lines in connection, or the like. With this arrangement, the step difference formed by the first optical functional layer 71 and the second optical functional layer 72 can be smaller, and the edges of the first optical functional layer 71 and the second optical functional layer 72 can be smoother.

Figure 20:
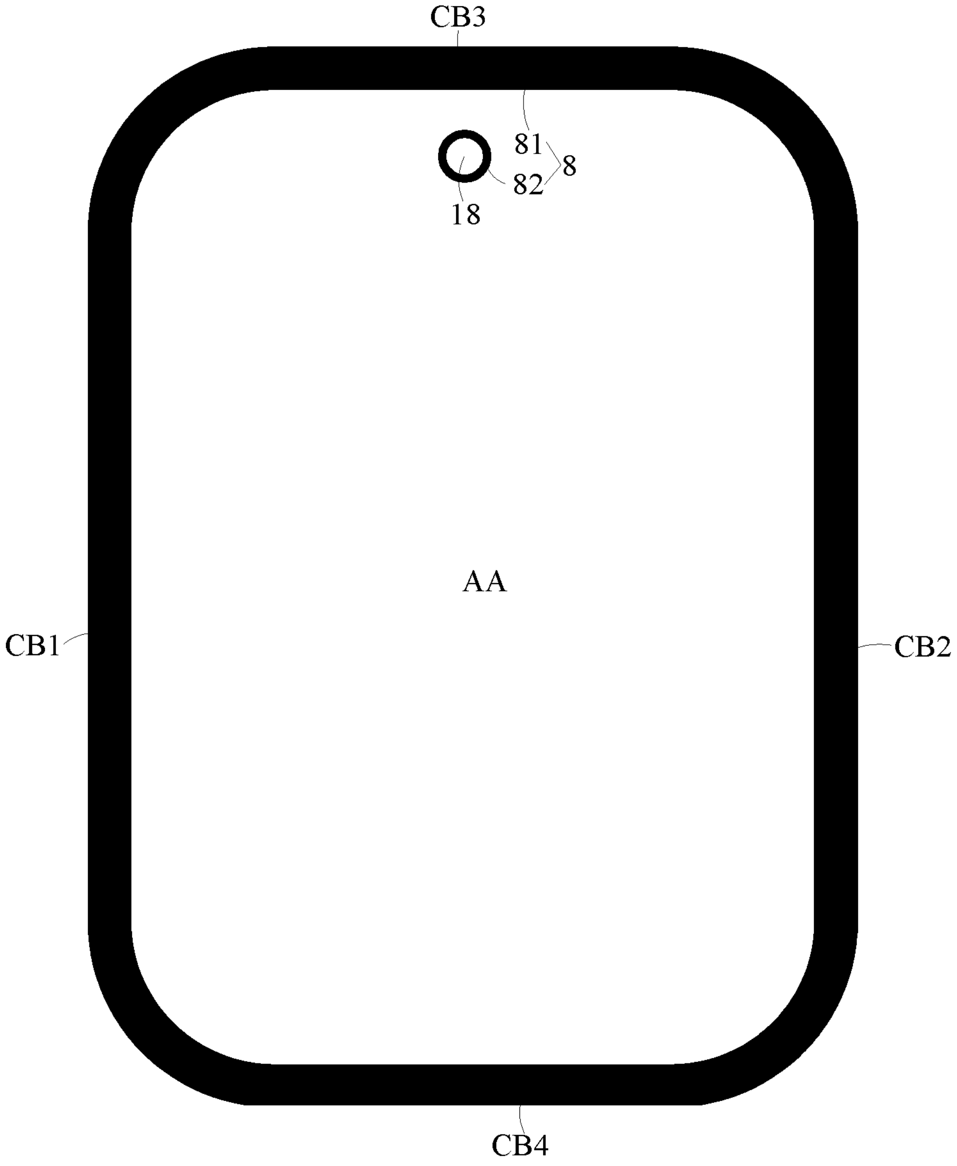
FIG. 20 is a schematic structural diagram of a shielding layer provided in the display panel of this disclosure.
Figure 21:
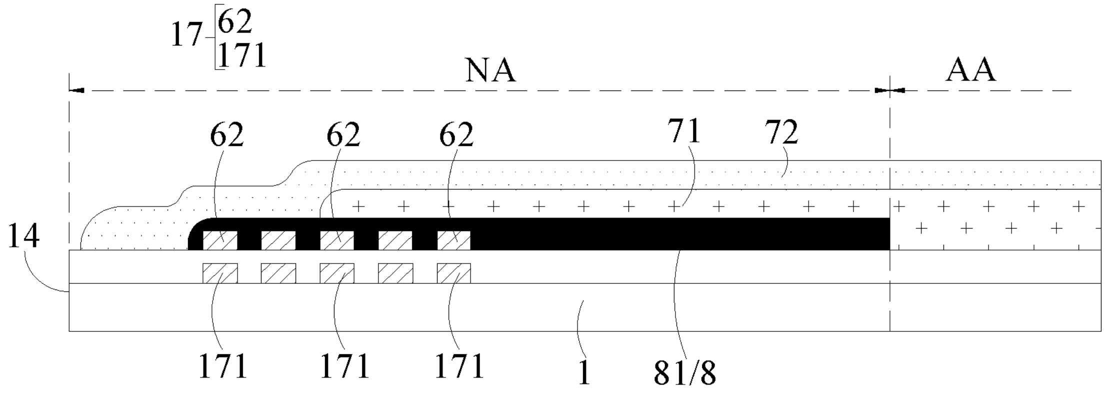
FIG. 21 is a schematic structural diagram of a first shielding part provided in the display panel of this disclosure.

Further, with reference to FIG. 20 and FIG. 21, the display panel 100 may further include a shielding layer 8, which is disposed on a side of the touch layer group 5 away from the base substrate 1. Specifically, the shielding layer 8 is disposed between the second touch layer 53 and the second optical functional layer 72 and between the second touch layer 53 and the first optical functional layer 71, that is, the shielding layer 8 is provided on a side of the second touch layer 53 away from the base substrate 1. The shielding layer 8 may include a first shielding part 81 located in the non-display area NA. The first shielding part 81 may shield the non-display area NA of the display panel 100.

Furthermore, a reflective layer 17 is provided in the non-display area NA, and the orthographic projection of the reflective layer 17 on the base substrate 1 is located within the orthographic projection of the first shielding part on the base substrate 1. For example, the orthographic projection of the first shielding part on the substrate 1 may coincide with the orthographic projection of the reflective layer 17 on the base substrate 1. The first shielding part can block external ambient light from reaching the reflective layer 17, thereby preventing the reflective layer 17 from reflecting the ambient light and affecting the display effect of the display panel 100. The orthographic projection of the first shielding part on the base substrate 1 may also cover the orthographic projection of the reflective layer 17 on the base substrate 1, and the orthographic projection of the first shielding part on the base substrate 1 has a larger area than that of the reflective layer 17 on the base substrate, so that the first shielding part not only covers the side of the reflective layer 17 away from the base substrate 1, but also covers the side walls of the reflective layer 17, thereby further ensuring the shielding effect of the first shielding part on the reflective layer 17, so as to prevent the reflective layer 17 from reflecting ambient light under strong ambient light and affecting the display effect of the display panel 100.

The reflective layer 17 may include a touch lead 62 and a first lead 171. The touch lead 62 and the first lead 171 are both provided between the base substrate 1 and the first optical functional layer 71. Specifically, the first lead 171 may include data lines, gate lines, power lines (VSS) and the like. Since the data lines, gate lines, power lines and the like are generally made of metal and have high reflectivity, after being blocked by the first shielding part, the data lines, gate lines, power lines and the like can be prevented from reflecting ambient light under strong ambient light and affecting the display effect of the display panel 100.

In some other embodiments of this disclosure, as shown in FIG. 20, a light-transmitting part 18 is provided in the display area AA of the display panel 100, and the sub-pixels 35 and various wirings are not provided in the light-transmitting part 18. Therefore, the light transmittance of the light-transmitting part 18 is relatively high. A photodetector, a camera or the like may be provided on the side of the base substrate 1 away from the first optical functional layer 71, and may be provided opposite to the light-transmitting part 18. The light can be emitted to the photodetector through the light-transmitting part 18 to realize the photodetection function, or the light can be emitted to the camera through the light-transmitting part 18 to realize the optical imaging function.

However, there may be light leakage around the light-transmitting part 18, that is, the light from the sub-pixels 35 in the display area AA may be emitted through the light-transmitting part 18, and may further be emitted to the photodetector, camera or the like, thereby affecting the detection function of the photodetector or the imaging function of the camera.

In order to solve the above technical problems, the shielding layer 8 may also include a second shielding part 82. The second shielding part 82 may also be provided on the side of the touch layer group 5 away from the base substrate 1. The second shielding part 82 covers non-luminescent area around the light-transmitting part 18, that is, the orthographic projection of the second shielding part 82 on the base substrate 1 coincides with the orthographic projection of the non-luminescent area around the light-transmitting part 18 on the base substrate 1. The light emitted from the sub-pixels 35 can be blocked by the second shielding part 82 to prevent the light from being emitted through the light-transmitting part 18 or from being emitted to the photodetector or camera through the light-transmitting part 18 and, thus, avoid affecting the detection function of the photodetector or the imaging function of the camera.

In some embodiments, as shown in FIG. 4, the display panel 100 may further include a color film layer 9. The color film layer 9 may be disposed on a side of the second optical functional layer 72 away from the base substrate 1. The color film layer 9 may include multiple filter parts, and the filter parts are arranged opposite to the sub-pixels 35. The light emitted from the sub-pixels 35 can be filtered through the filter parts, so that the light emitted through the filter parts is light of a required color. The color film layer 9 may also include a black matrix. The black matrix is arranged in the display area AA. The black matrix divides the display area AA to form multiple light-transmitting areas. The light filter is provided in the light-transmitting areas. The black matrix is arranged oppositely to the non-luminous areas of the display area AA. The black matrix can block the gate lines, data lines, and the like of the display area AA. The black matrix is not arranged in the non-display area NA, so it cannot block the reflection of data lines, gate lines, power lines, and the like in the non-display area NA. In addition, in some other embodiments of this disclosure, the color film layer 9 can also be provided on the side of the first optical functional layer 71 close to the base substrate 1. Specifically, the color film layer 9 can be provided between the first optical functional layer 71 and the second touch layer 53.

Based on the same inventive concept, exemplary embodiments of this disclosure also provide a display device, which may include the display panel 100 described in any forgoing embodiment(s). The specific structure of the display panel 100 has been described in detail above and, thus, will not be repeated here.

The specific type of the display device is not particularly limited. Any type of display device commonly used in the field can be used, including, for example, mobile devices such as mobile phones, wearable devices such as watches, VR devices, and the like. Those skilled in the art can make selection according to specific usage of the display device, which will not be elaborated here.

It should be noted that, in addition to the display panel 100, the display device further includes other necessary parts and components. Taking a display as an example, it may further include, for example, a casing, a circuit board, a power cord, and the like. Those skilled in the art can make supplement according to specific usage requirement of the display device, which will not be elaborated here.

Compared with the prior art, the beneficial effects of the display device according to some embodiments of this disclosure are the same as the beneficial effects of the display panel 100 according to the forgoing embodiments, and will not be repeated here.

Other embodiments of the disclosure will be readily apparent to those skilled in the art from consideration of the specification and practice of the invention disclosed herein. This application is intended to cover any variations, uses, or adaptations of the disclosure that follow the general principles of the disclosure and include common knowledge or customary technical means in the art that are not disclosed in the disclosure. It is intended that the specification and examples be considered as exemplary only.

What is claimed is:

1. A display panel having a display area and a non-display area, wherein a cutting channel is provided in the non-display area, and the display panel comprises:

a base substrate; and a first optical functional layer, provided on a side of the base substrate, wherein the first optical functional layer in the display area is provided with an optical pattern, and a non-zero first distance is provided between an edge line, close to the cutting channel, of the first optical functional layer and the cutting channel; and a second optical functional layer, provided on a side of the first optical functional layer away from the base substrate, wherein the second optical functional layer covers the optical pattern of the first optical functional layer and extends to a side of the base substrate close to the cutting channel, a non-zero second distance is provided between an edge line, close to the cutting channel, of the second optical functional layer and the cutting channel, and the first distance is greater than the second distance;

wherein a refractive index of the first optical function layer is different from a refractive index of the second optical function layer.

2. The display panel according to claim 1, wherein a difference between the first distance and the second distance is greater than or equal to 30 microns.

3. The display panel according to claim 1, further comprising:

a crack blocking structure, provided on a side of the cutting channel close to the display area, wherein the first optical functional layer covers a part of the crack blocking structure close to the display area, and the second optical functional layer covers all of the crack blocking structure.

4. The display panel according to claim 1, wherein the first distance is substantially equal to a distance between an edge line, close to the cutting channel, of the display area and the cutting channel, and the second optical functional layer extend to an edge of the cutting channel close to the display area.

5. The display panel according to claim 1, further comprising:

a touch lead, provided between the base substrate and the first optical functional layer, and located in the non-display area, wherein the first optical functional layer covers the touch lead, and a part of the non-display area, where the touch lead faces away from the display area, is not provided with the first optical functional layer.

6. The display panel according to claim 5, wherein the first optical functional layer comprises a plurality of covering parts, with each covering part covers one touch lead.

7. The display panel according to claim 5, wherein the non-display area comprises a bonding area, a bonding pin is provided in the bonding area, the touch lead is connected to the bonding pin, and, in a side of the non-display area close to the bonding area, the first optical functional layer only covers the touch lead.

8. The display panel according to claim 5, wherein the refractive index of the second optical function layer is greater than the refractive index of the first optical function layer, the optical pattern is a recessed part, and at least part of the second optical function layer is located within the recessed part.

9. The display panel according to claim 8, wherein the first optical functional layer and the second optical functional layer are both made from organic insulation materials, and a thickness of the second optical functional layer is greater than a thickness of the first optical functional layer.

10. The display panel according to claim 8, further comprising:

a display substrate, provided between the base substrate and the first optical functional layer, wherein the display substrate comprises a plurality of sub-pixels arranged opposite to the recessed part.

11. The display panel according to claim 10, further comprising:

an encapsulation layer group, provided on a side of the display substrate away from the base substrate; and a touch layer group, provided on a side of the encapsulation layer group away from the base substrate, wherein the first optical functional layer is provided on a side of the touch layer group away from the base substrate.

12. The display panel according to claim 11, wherein the touch layer group comprises:

a first touch layer, provided on the side of the encapsulation layer group away from the base substrate;

a touch insulation layer, provided on a side of the first touch layer away from the base substrate; and a second touch layer, provided on a side of the touch insulation layer away from the base substrate;

wherein, the touch lead comprises a first touch sub-lead, or a second touch sub-lead, or the first touch sub-lead and the second touch sub-lead that are stacked and connected; the first touch layer comprises the first touch sub-lead, and the second touch layer comprises the second touch sub-lead.

13. The display panel according to claim 1, wherein the non-display area comprises a bending area, and the display panel further comprises:

a third inorganic layer, provided between the base substrate and a light-emitting layer group, wherein a first groove is provided on the third inorganic layer, an orthographic projection of the bending area on the base substrate overlaps with an orthographic projection of the first groove on the base substrate, and the third inorganic layer is not provided in the bending area.

14. The display panel according to claim 13, wherein an edge line of the bending area close to the display area is a first edge line, the first optical functional layer and the second optical functional layer both extend into the bending area, a non-zero third distance is provided between an edge line, close to the first edge line, of the first optical function layer and the first edge line, a non-zero fourth distance is provided between an edge line, close to the first edge line, of the second optical function layer and the first edge line, and the fourth distance is greater than the third distance.

15. The display panel according to claim 13, wherein an edge line of the bending area close to the display area is a first edge line, the first optical functional layer and the second optical functional layer both extend into a side of the bending area close to the display area, a non-zero third distance is provided between an edge line, close to the first edge line, of the first optical function layer and the first edge line, a non-zero fourth distance is provided between an edge line, close to the first edge line, of the second optical function layer and the first edge line, and the third distance is greater than the fourth distance.

16. The display panel according to claim 14, wherein orthographic projections of the first optical functional layer and the second optical functional layer on the base substrate overlap with the orthographic projection of the first groove on the base substrate.

17. The display panel according to claim 14, wherein an absolute value of a difference between the fourth distance and the third distance is greater than or equal to 5 microns.

18. The display panel according to claim 1, further comprising:

a bonding pin, provided in the non-display area, wherein the first optical functional layer and the second optical functional layer both extend to a side of the bonding pin away from the base substrate, a non-zero fifth distance is provided between an edge line, close to the bonding pin, of the first optical functional layer and an edge line, close to the display area, of the bonding pin, a non-zero sixth distance is provided between an edge line, close to the bonding pin, of the second optical functional layer and the edge line, close to the display area, of the bonding pin, and the sixth distance is greater than the fifth distance.

19. The display panel according to claim 18, wherein an absolute value of a difference between the sixth distance and the fifth distance is greater than or equal to 5 microns.

20. A display device, comprising a display panel having a display area and a non-display area, wherein a cutting channel is provided in the non-display area, and the display panel comprises:

a base substrate; and a first optical functional layer, provided on a side of the base substrate, wherein the first optical functional layer in the display area is provided with an optical pattern, and a non-zero first distance is provided between an edge line, close to the cutting channel, of the first optical functional layer and the cutting channel; and a second optical functional layer, provided on a side of the first optical functional layer away from the base substrate, wherein the second optical functional layer covers the optical pattern of the first optical functional layer and extends to a side of the base substrate close to the cutting channel, a non-zero second distance is provided between an edge line, close to the cutting channel, of the second optical functional layer and the cutting channel, and the first distance is greater than the second distance;

wherein a refractive index of the first optical function layer is different from a refractive index of the second optical function layer.

* * * * *